US010269707B2

(12) United States Patent
Anderson et al.

(10) Patent No.: US 10,269,707 B2
(45) Date of Patent: Apr. 23, 2019

(54) SEMICONDUCTOR STRUCTURES WITH FIELD EFFECT TRANSISTOR(S) HAVING LOW-RESISTANCE SOURCE/DRAIN CONTACT(S)

(71) Applicant: GlobalFoundries Inc., Grand Cayman (KY)

(72) Inventors: Brent A. Anderson, Jericho, VT (US); Jeffrey B. Johnson, Essex Junction, VT (US); Edward J. Nowak, Essex Junction, VT (US)

(73) Assignee: GLOBALFOUNDRIES INC., Grand Cayman (KY)

( * ) Notice: Subject to any disclaimer, the term of this patent is extended or adjusted under 35 U.S.C. 154(b) by 118 days.

(21) Appl. No.: 15/634,135

(22) Filed: Jun. 27, 2017

(65) Prior Publication Data

US 2017/0294385 A1    Oct. 12, 2017

Related U.S. Application Data

(62) Division of application No. 15/263,551, filed on Sep. 13, 2016, now Pat. No. 9,786,751, which is a division
(Continued)

(51) Int. Cl.
*H01L 21/28* (2006.01)
*H01L 29/66* (2006.01)
(Continued)

(52) U.S. Cl.
CPC .... *H01L 23/5283* (2013.01); *H01L 21/76816* (2013.01); *H01L 21/76895* (2013.01);
(Continued)

(58) Field of Classification Search
CPC ..... H01L 21/823807; H01L 21/823814; H01L 21/823828; H01L 27/092; H01L 27/0207;
(Continued)

(56) References Cited

U.S. PATENT DOCUMENTS 8,642,471 B2    2/2014    Yin et al.
8,643,122 B2    2/2014    Alptekin et al.
(Continued)

FOREIGN PATENT DOCUMENTS

CN    103811420 A    5/2014
JP    2005-167279 A    6/2005

OTHER PUBLICATIONS

Office Action Communication, U.S. Appl. No. 14/523,083, dated Sep. 11, 2015, pp. 1-8.
(Continued)

*Primary Examiner* — Brian Turner
(74) *Attorney, Agent, or Firm* — Gibb & Riley, LLC; Michael J. LeStrange, Esq.

(57) ABSTRACT

Disclosed are semiconductor structures comprising a field effect transistor (FET) having a low-resistance source/drain contact and, optionally, low gate-to-source/drain contact capacitance. The structures comprise a semiconductor body and, contained therein, first and second source/drain regions and a channel region. A first gate is adjacent to the semiconductor body at the channel region and a second, non-functioning, gate is adjacent to the semiconductor body such that the second source/drain region is between the first and second gates. First and second source/drain contacts are on the first and source/drain regions, respectively. The second source/drain contact is wider than the first and, thus, has a lower resistance. Additionally, spacing of the first and second source/drain contacts relative to the first gate can be such that the first gate-to-second source/drain contact capacitance is equal to or less than the first gate-to-first source/drain contact capacitance. Also disclosed are associated formation methods.

20 Claims, 18 Drawing Sheets

Related U.S. Application Data of application No. 14/523,083, filed on Oct. 24, 2014, now Pat. No. 9,496,394.

(51) Int. Cl.

| | | |
|---|---|---|
| *H01L 21/768* | (2006.01) | |
| *H01L 23/485* | (2006.01) | |
| *H01L 23/535* | (2006.01) | |
| *H01L 29/78* | (2006.01) | |
| *H01L 23/528* | (2006.01) | |

(52) U.S. Cl.
CPC ...... *H01L 23/535* (2013.01); *H01L 29/66795*
(2013.01); *H01L 29/7851* (2013.01)

(58) Field of Classification Search
CPC ............. H01L 21/28008; H01L 27/088; H01L 21/823878
See application file for complete search history.

(56) References Cited

U.S. PATENT DOCUMENTS

| | | | |
|---|---|---|---|
| 8,692,335 | B2 | 4/2014 | Yin et al. |
| 2005/0200026 | A1 | 9/2005 | Liaw et al. |
| 2007/0145519 | A1 | 6/2007 | Peng et al. |
| 2007/0196934 | A1 | 8/2007 | Hiang et al. |
| 2008/0303088 | A1* | 12/2008 | Pang ................ H01L 29/66689 257/337 |
| 2009/0218640 | A1 | 9/2009 | Hampp |
| 2009/0321820 | A1 | 12/2009 | Yamakawa |
| 2011/0291197 | A1 | 12/2011 | Wu et al. |
| 2012/0098073 | A1 | 4/2012 | Yu et al. |
| 2012/0205728 | A1 | 8/2012 | Yin et al. |
| 2012/0217589 | A1 | 8/2012 | Yin et al. |
| 2013/0102138 | A1 | 4/2013 | Yeh et al. |
| 2013/0119474 | A1 | 5/2013 | Schultz |
| 2014/0035087 | A1 | 2/2014 | Liu et al. |
| 2014/0191295 | A1* | 7/2014 | Greene ................ H01L 21/28 257/288 |
| 2015/0235948 | A1 | 8/2015 | Song et al. |
| 2015/0340467 | A1 | 11/2015 | Bouche et al. |

OTHER PUBLICATIONS

Office Action Communication, U.S. Appl. No. 14/523,083, dated Nov. 30, 2015, pp. 1-17.
Office Action Communication, U.S. Appl. No. 14/523,083, dated May 23, 2016, pp. 1-23.
Office Action Communication, U.S. Appl. No. 14/523,083, dated Jul. 27, 2016, pp. 1-9.
Notice of Allowance Communication, U.S. Appl. No. 14/523,083, dated Aug. 16, 2016, pp. 1-8.
Office Action Communication, U.S. Appl. No. 15/263,551, dated Jan. 10, 2017, pp. 1-9.
Office Action Communication, U.S. Appl. No. 15/263,551, dated Feb. 23, 2017, pp. 1-16.
Office Action Communication, U.S. Appl. No. 15/263,551, dated May 11, 2017, pp. 1-23.
Notice of Allowance Communication, U.S. Appl. No. 15/263,551, dated Jun. 8, 2017, pp. 1-9.

* cited by examiner

SEMICONDUCTOR STRUCTURES WITH FIELD EFFECT TRANSISTOR(S) HAVING LOW-RESISTANCE SOURCE/DRAIN CONTACT(S)

CROSS-REFERENCE TO RELATED APPLICATIONS

The present invention claims the benefit under 35 U.S.C. § 120 as a divisional of U.S. patent application Ser. No. 15/263,551, which was filed on Sep. 13, 2016, issued as U.S. Pat. No. 9,786,751 on Oct. 10, 2017, and is a divisional of U.S. patent application Ser. No. 14/523,083, which was filed on Oct. 24, 2014, and issued as U.S. Pat. No. 9,496,394 on Nov. 15, 2016, the entire teachings of which are incorporated herein by reference.

BACKGROUND

The present disclosure relates to semiconductor structures and, more specifically, to semiconductor structures comprising at least one field effect transistor (FET) having a low-resistance source/drain contact and methods of forming these semiconductor structures.

Integrated circuit design decisions are often driven by device scalability, device density, manufacturing efficiency and costs. In semiconductor structures comprising field effect transistors (FETs), such as planar FETs or multi-gate non-planar FETs (e.g., fin-type FETs (FINFETs), also referred to herein as a dual gate FETs, and tri-gate FETs), size scaling reduces the width of contacts and, thereby increases contact resistance. Size scaling also reduces the separation distances between source/drain contacts and gates and, thereby increases gate-to-source/drain contact capacitance. Increases in the source/drain contact resistance and in the gate-to-source/drain contact capacitance can negatively impact device performance. Therefore, there is a need in the art for improved semiconductor structures and methods of forming these structures with one or more field effect transistors each having a source/drain contact with relatively low resistance and/or having relatively low gate-to-source/drain contact capacitance in order to optimize device performance.

SUMMARY

Disclosed herein are embodiments of a first semiconductor structure. The first semiconductor structure can comprise a semiconductor body. The semiconductor body can comprise at least the following components of a first field effect transistor (FET): a first source/drain region, a second source/drain region, and a channel region between the first source/drain region and the second source/drain region. The first semiconductor structure can further comprise multiple gates. These gates can comprise a first gate adjacent to the semiconductor body at the channel region and a second gate, which is non-functioning, adjacent to the semiconductor body such that the second source/drain region is between the first gate and second gate. The first semiconductor structure can further comprise multiple source/drain contacts. These source/drain contacts can comprise a first source/drain contact on the first source/drain region and a second source/drain contact on the second source/drain region. The second source/drain contact can be wider than the first source/drain contact and, thus, can have a lower resistance than the first source/drain contact. The second source/drain contact can also be closer to the second gate than it is to the first gate.

In one embodiment, the second source/drain contact can actually extend laterally onto the second gate. More specifically, in one embodiment the second source/drain contact can be separated from the first gate by a first distance and separated from the second gate by a second distance that is less than the first distance. In another embodiment, the second source/drain contact can be separated from the first gate and can extend laterally onto the second gate. In either case, the first source/drain contact can be separated from the first gate by some distance (referred to herein as a third distance), which is either approximately equal to the first distance that separates the second source/drain contact from the first gate or less than that first distance.

Disclosed herein are also embodiments of a second semiconductor structure. The second semiconductor structure can comprise semiconductor body and an isolation region laterally surrounding the semiconductor body. The semiconductor body can comprise at least the following components of a first field effect transistor (FET): a first source/drain region, a second source/drain region at one end of the semiconductor body, and a channel region between the first source/drain region and the second source/drain region. The second semiconductor structure can further comprise multiple gates. These gates can comprise a first gate adjacent to the semiconductor body at the channel region and a second gate, which is non-functioning, adjacent to the semiconductor body at an interface between the isolation region and the second source/drain region such that the second source/drain region is between the first gate and second gate. The second semiconductor structure can further comprise multiple source/drain contacts. These source/drain contacts can comprise a first source/drain contact on the first source/drain region and a second source/drain contact on the second source/drain region. The second source/drain contact can be wider than the first source/drain contact and, thus, can have a lower resistance than the first source/drain contact. Additionally, the second source/drain contact can extend laterally onto the second gate.

Also disclosed herein is a method of forming the embodiments of the first semiconductor structure described above. The method can comprise forming a semiconductor body comprising at least the following components of a first field effect transistor (FET): a first source/drain region, a second source/drain region, and a channel region between the first source/drain region and the second source/drain region. The method can further comprise forming multiple gate. These gates can comprise a first gate adjacent to the semiconductor body at the channel region and a second gate, which is non-functioning, adjacent to the semiconductor body such that the second source/drain region is between the first gate and second gate. The method can further comprise forming multiple source/drain contacts. These source/drain contacts can comprise a first source/drain contact on the first source/drain region and a second source/drain contact on the second source/drain region. These source/drain contacts can be formed such that the second source/drain contact is wider than the first source/drain contact and, thus, such that it has a lower resistance than the first source/drain contact. Additionally, these source/drain contacts can be formed such that the second source/drain contact is closer to the second gate than the first gate. For example, in this method, the multiple source/drain contacts can be formed such that the second source/drain contact is separated from the first gate by a first distance and such that the second source/drain contact is separated from the second gate by a second distance that is less than the first distance. Alternatively, the multiple source/drain contacts can be formed such that the second source/ drain contact is separated from the first gate and such that the second source/drain contact actually extends laterally onto the second gate. In either case, the multiple contacts can be formed such that the first source/drain contact is separated from the first gate by some distance (referred to herein as a third distance), which is either approximately equal to the first distance that separates the second source/drain contact from the first gate or less than that first distance.

Also disclosed herein is a method of forming the embodiments of the second semiconductor structure described above. This method can comprise forming a semiconductor body that is laterally surrounded by an isolation region and that comprises at least the following components of a first field effect transistor (FET): a first source/drain region, a second source/drain region at one end of the semiconductor body, and a channel region between the first source/drain region and the second source/drain region. The method can further comprise forming multiple gates. These gates can comprise a first gate adjacent to the semiconductor body at the channel region and a second gate, which is non-functioning, positioned adjacent to the semiconductor body at an interface between the isolation region and the second source/drain region such that the second source/drain region is between the first gate and second gate. The method can further comprise forming multiple source/drain contacts. These source/drain contacts can comprise a first source/drain contact on the first source/drain region and a second source/drain contact on the second source/drain region. The source/drain contacts can be formed such that the second source/drain contact is wider than the first source/drain contact and, thus, such that it has a lower resistance than the first source/drain contact. Additionally, the source/drain contacts can be formed such that the second source/drain contact actually extends laterally onto the second gate.

BRIEF DESCRIPTION OF THE DRAWINGS

The embodiments herein will be better understood from the following detailed description with reference to the drawings, which are not necessarily drawn to scale and in which.

DETAILED DESCRIPTION

Figure 1A:
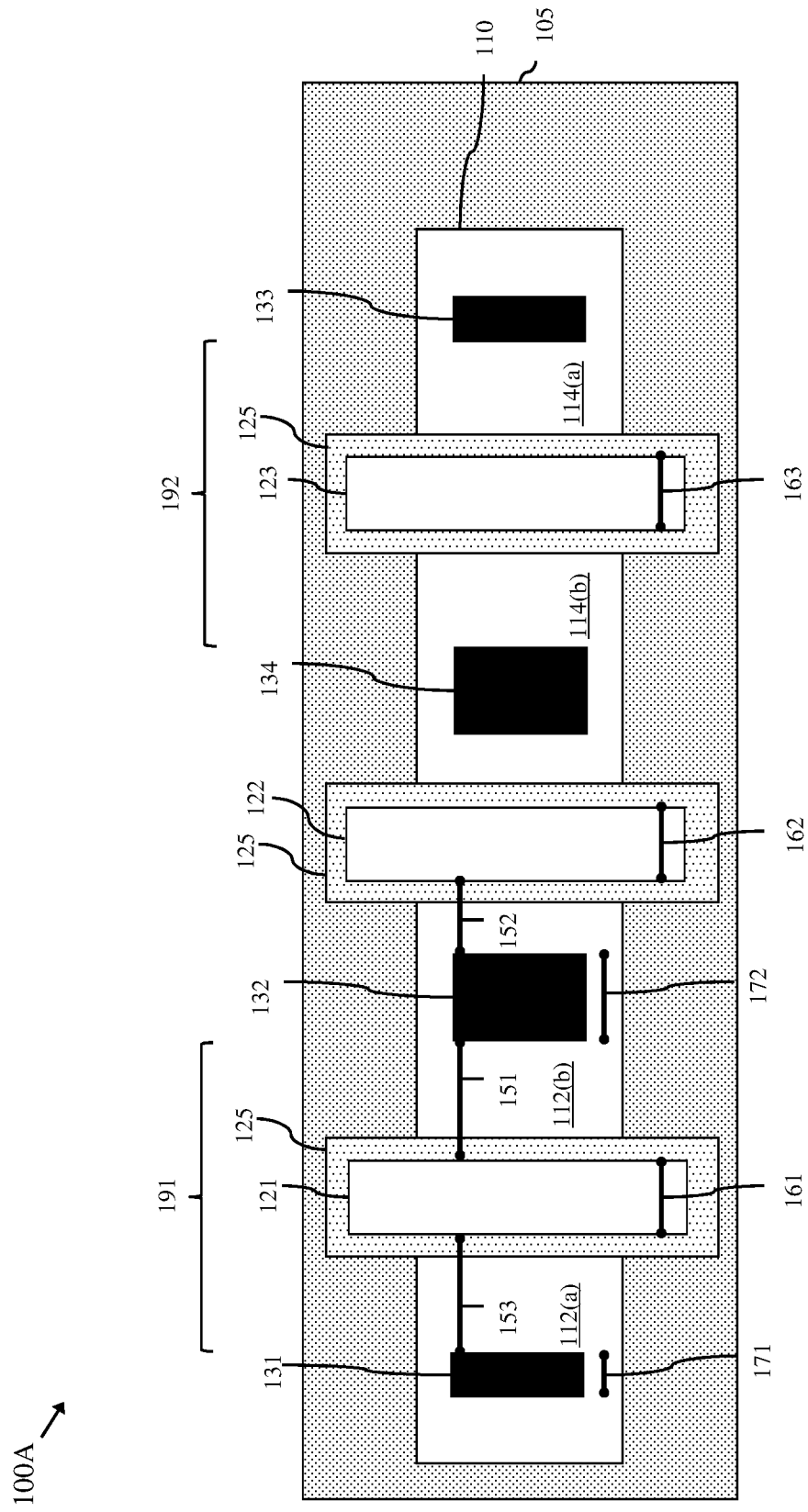
FIGS. 1A and 1B are top view and cross-section diagrams, respectively, of an embodiment of a first semiconductor structure comprising at least one field effect transistor (FET) having a low-resistance source/drain contact.

As mentioned above, integrated circuit design decisions are often driven by device scalability, device density, manufacturing efficiency and costs. In semiconductor structures comprising field effect transistors (FETs), such as planar FETs or multi-gate non-planar FETs (e.g., fin-type FETs (FINFETs), also referred to herein as a dual gate FETs, and tri-gate FETs), size scaling reduces the width of contacts and, thereby increases contact resistance. Size scaling also reduces the separation distances between source/drain contacts and gates and, thereby increases gate-to-source/drain contact capacitance. Increases in the source/drain contact resistance and in the gate-to-source/drain contact capacitance can negatively impact device performance.

In view of the foregoing, disclosed herein are semiconductor structures comprising at least one field effect transistor (FET) having a low-resistance source/drain contact and, optionally, low gate-to-source/drain contact capacitance. The semiconductor structures can comprise a semiconductor body and, within the semiconductor body, first and second source/drain regions and a channel region for a FET. A first gate for the FET can be adjacent to the semiconductor body at the channel region and a non-functioning second gate can be adjacent to the semiconductor body such that the second source/drain region is between the first and second gates. First and second source/drain contacts can be on the first and source/drain regions, respectively. The second source/drain contact can be wider than the first so as to have a lower resistance than the first source/drain contact. Additionally, spacing of the first and second source/drain contacts relative to the first gate can be such that the first gate-to-second source/drain contact capacitance is equal to or less than the first gate-to-first source/drain contact capacitance. Also disclosed are methods of forming these semiconductor structures.

More particularly, FIGS. 1A-1B, 2B-2B, 3A-3B and 4A-4B illustrate embodiments 100A-D of a first semiconductor structure comprising a first field effect transistor (FET) 191 and, optionally, a second FET 192. FIGS. 5A-5B and 6A-6B illustrate embodiments 200A-B of a second semiconductor structure comprising a first field effect transistor (FET) 291 and, optionally, a second FET 292. For purposes of illustration, the embodiments 100A-D and 200A-B of the first and semiconductor structures are described below and shown in the Figures as comprising the optional second FET 192, 292.

The first and second semiconductor structures 100A-D and 200A-B can comprise semiconductor-on-insulator (SOI) structures. For example, these structures can each comprise a semiconductor substrate 102, 202 (e.g., a silicon substrate or any other suitable semiconductor substrate, such as a germanium substrate, a gallium arsenide substrate, a gallium nitride substrate, etc.), an insulator layer 103, 203 (e.g., a silicon dioxide layer, a silicon nitride layer, a silicon oxynitride layer or any other suitable insulator layer) on the semiconductor substrate 102, 202 and a semiconductor layer on the insulator layer 103, 203. Alternatively, these structures can comprise a bulk semiconductor structures. For example, they can each comprise a bulk semiconductor substrate (e.g., a bulk silicon substrate or any other suitable bulk semiconductor structure (e.g., a bulk germanium substrate, a bulk gallium arsenide substrate, a bulk gallium nitride substrate, etc.), wherein an upper portion of the semiconductor substrate is isolated from a lower portion of the semiconductor substrate by, for example, a buried well region.

Referring specifically to FIGS. 1A-1B, 2B-2B, 3A-3B and 4A-4B, each of the embodiments 100A-D of the first semiconductor structure can comprise a semiconductor body 110. As illustrated, the semiconductor body 110 can comprise an essentially rectangular-shaped planar semiconductor body for planar field effect transistor(s). A planar semiconductor body can be defined by a shallow trench isolation (STI) region 105 in the semiconductor layer above the insulator layer 103 in an SOI structure (or in the upper portion of the substrate in a bulk semiconductor structure) such that the STI region 105 laterally surrounds the semiconductor body 110 (i.e., is adjacent to opposing sides and ends of the semiconductor body 110). Although not shown, the semiconductor body 110 can, alternatively, comprise an essentially rectangular-shaped non-planar semiconductor body (also referred to herein as a semiconductor fin) for multi-gate non-planar field effect transistor(s) (e.g., dual-gate FETs, also referred to herein as fin-type FETs, and tri-gate FETs). A non-planar semiconductor body can be defined (e.g., patterned and etched) from the semiconductor layer above the insulator layer 103 in an SOI structure (or in the upper portion of the substrate in a bulk semiconductor structure).

In any case, in each of the embodiments 100A-D of the first semiconductor structure, the semiconductor body 110 can comprise at least the following components of the first FET 191: a first source/drain region 112(*a*); a second source/drain region 112(*b*); and a channel region 111 positioned laterally between the first source/drain region 112(*a*) and the second source/drain region 112(*b*). In each of the embodiments 100A-D of the semiconductor structure, the semiconductor body 110 can further comprise the following components of the second FET 192: an additional first source/drain region 114(*a*); an additional second source/drain region 114(*b*); and an additional channel region 113 positioned laterally between the additional first source/drain region 114(*a*) and the additional second source/drain region 114(*b*). The additional second source/drain region 114(*b*) of the second FET 192 can be positioned adjacent to the second source/drain region 112(*b*) of the first FET 191 and a well region 115 can be positioned laterally between and can physical separate the second source/drain region 112(*b*) and additional second source/drain region 114(*b*). The well region 115 can, for example, have the same type conductivity as the channel region 111. Optionally, although not shown, the semiconductor body 110 can further comprise one or more additional components for one or both of the FETs 191 and 192 including, but not limited to, halo region(s) and source/drain extension region(s). Such regions are well known in the art and, thus, the details thereof are omitted from this specification in order to allow the reader to focus on the salient aspects of the disclosed semiconductor structures.

Each of the embodiments 100A-D of the first semiconductor structure can further comprise multiple gates. The multiple gates can comprise a first gate 121 for the first FET 191 adjacent to the semiconductor body 110 at the channel region 111; a second gate 122, which is a non-functioning gate (i.e., an inactive gate), adjacent to the semiconductor body 110 such that the second source/drain region 112(*b*) is between the first gate 121 and the second gate 122; and an additional gate 123 for the second FET 192 adjacent to the semiconductor body 110 at the additional channel region 113. The multiple gates can have an approximately uniform pitch. The multiple gates can further all have the same gate length. That is, the length 161 of the first gate 121, the length 162 of the second gate 122 and the length 163 of the additional gate 123 can all be approximately equal, as shown in the embodiments 100A of FIGS. 1A-1B and 100C of FIGS. 3A-3B. Alternatively, the functioning and non-functioning gates can have different lengths. That is, the length 161 of the first gate 121 for the first FET 191 and the length 163 of the additional gate 123 for the second FET 192 can be greater than the length 162 of the second gate 122 (i.e., the non-functioning gate), as shown in embodiments 100B of FIGS. 2B-2B and 100D of FIGS. 4A-4B.

Figure 1B:
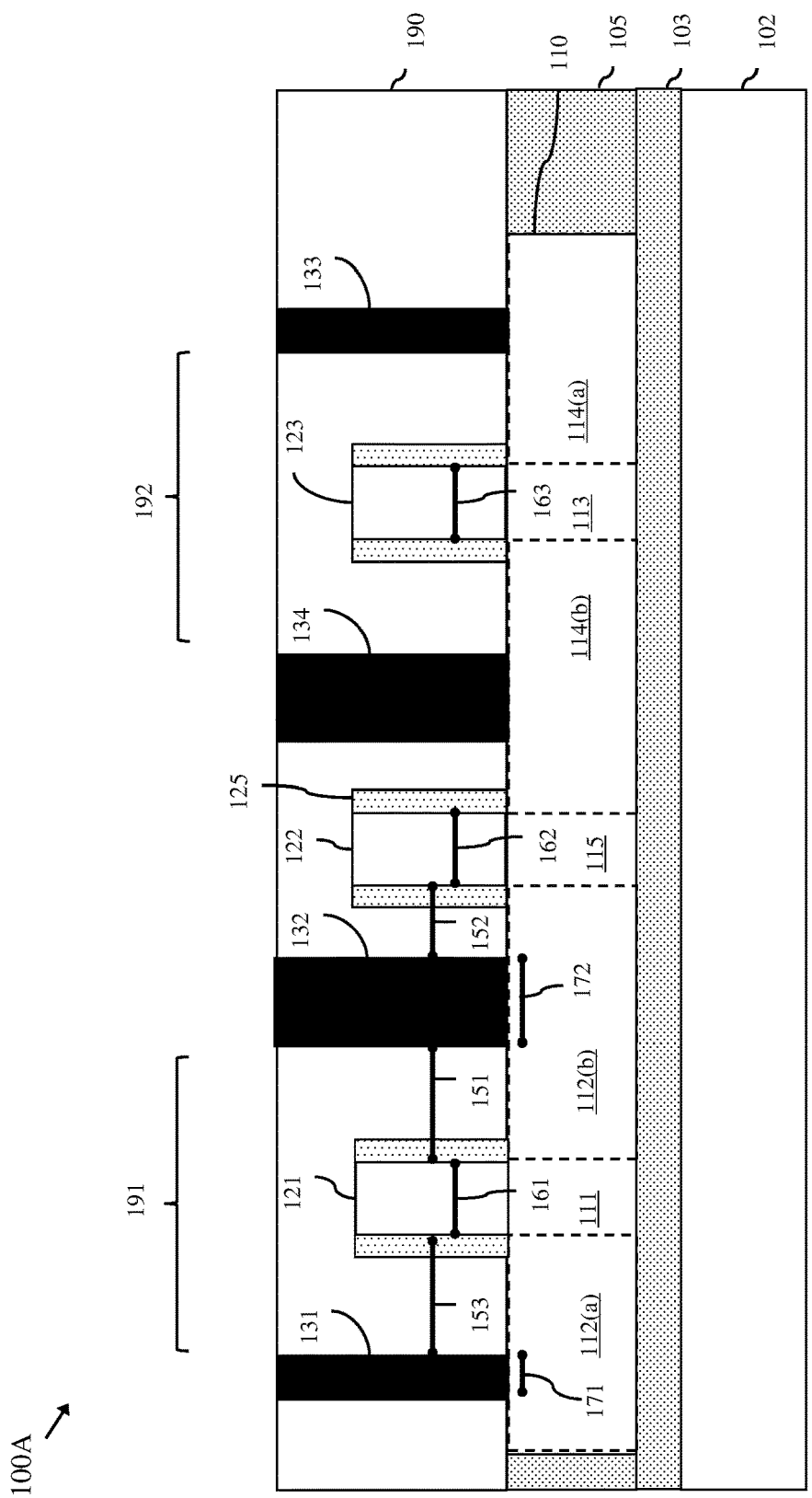
Figure 2B:
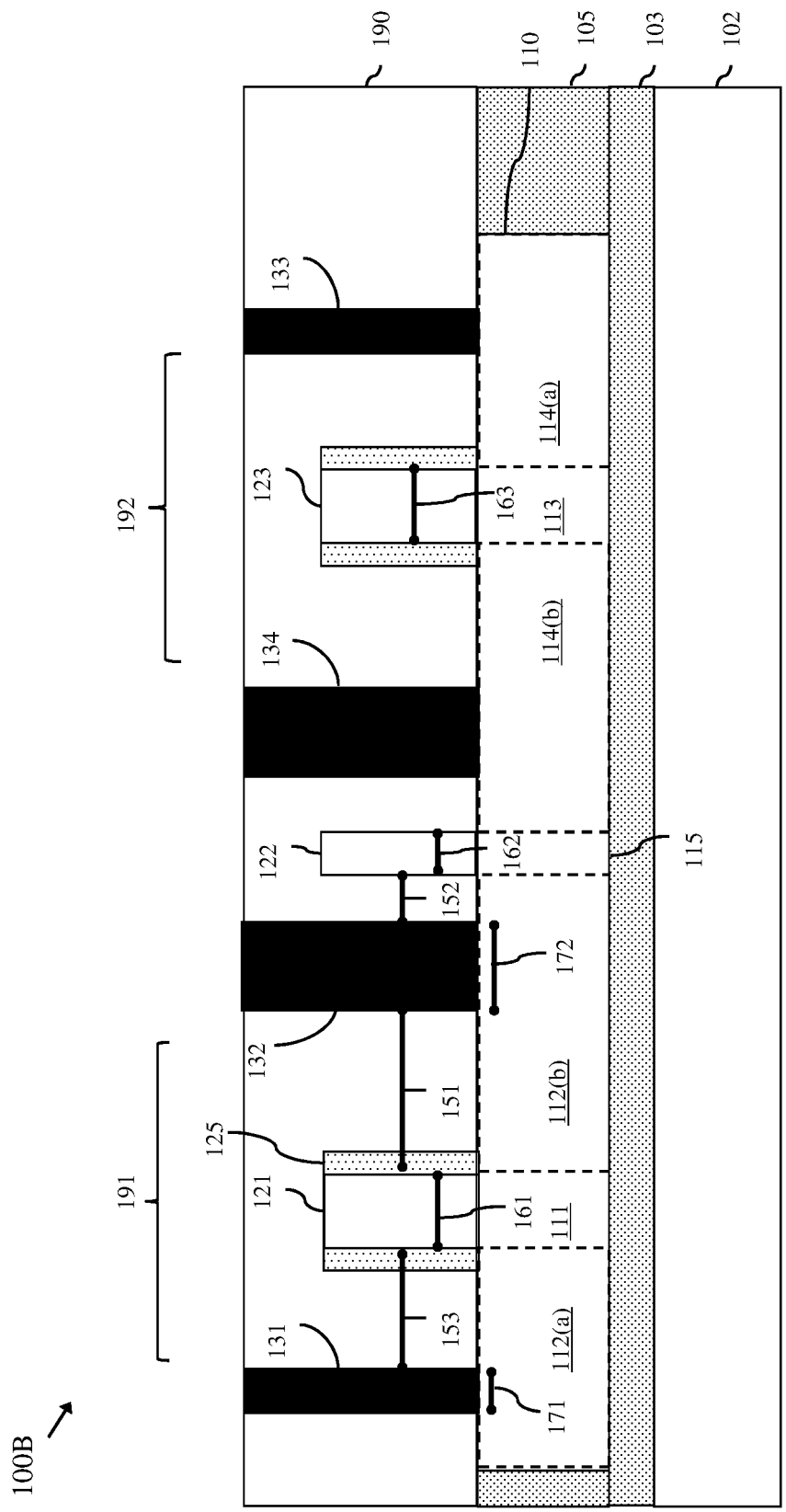
Figure 3A:
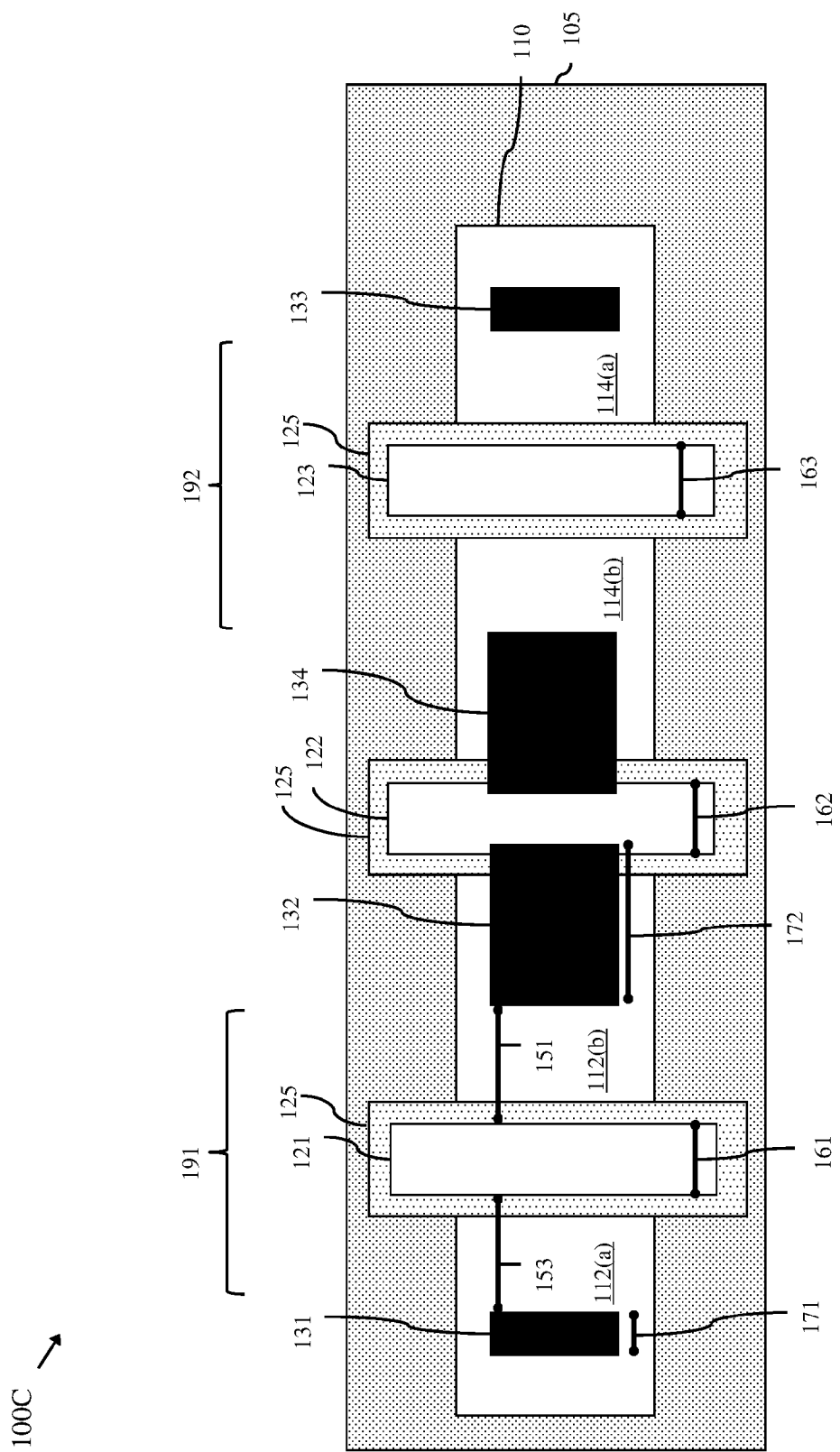
FIGS. 3A and 3B are top view and cross-section diagrams, respectively, of yet another embodiment of the first semiconductor structure.
Figure 3B:
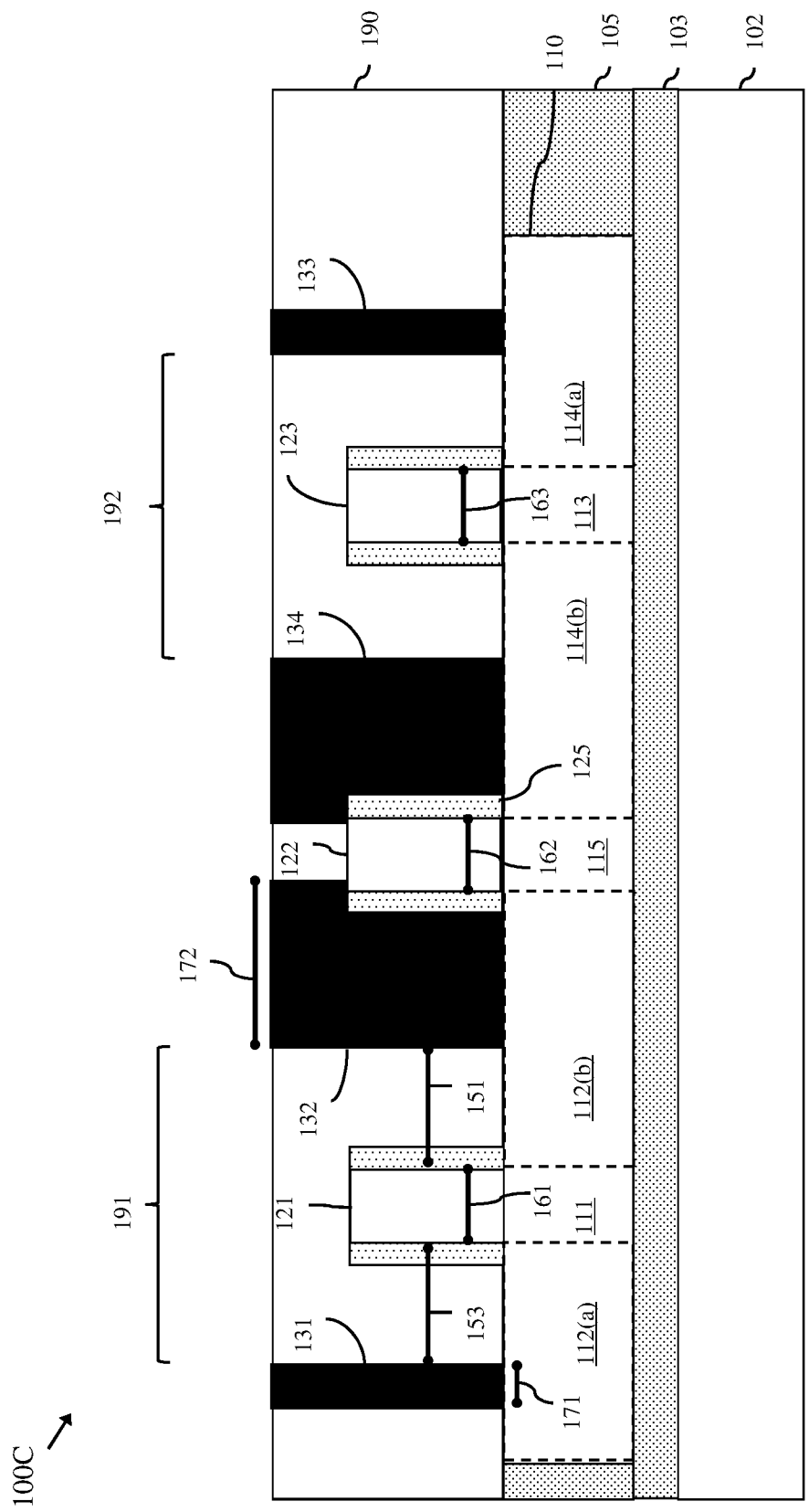

Gate sidewall spacers 125 (e.g., silicon nitride gate sidewall spacers) can be positioned adjacent to the sidewalls of all of the multiple gates, as shown in embodiments 100A of FIGS. 1A-1B and 100C of FIGS. 3A-3B. Alternatively, the non-functioning gates can be devoid of sidewall spacers. That is, only the first gate 121 of the first FET 191 and the additional gate 123 of the second FET 192 can have gate sidewall spacers 125, as shown in the embodiments 100B of FIGS. 2B-2B and 100D of FIGS. 4A-4B.

Each of the embodiments 100A-D of the first semiconductor structure can further comprise interlayer dielectric material 190 covering the multiple gates, covering the portions of the semiconductor body 110 adjacent to those gates (i.e., on the first and second source/drain regions 112(*a*)-(*b*) and on the additional first and second source/drain regions 114(*a*)-(*b*)) and covering the isolation region 105 surrounding the semiconductor body 110. The interlayer dielectric material can comprise, for example, one or more layers of any of the following: silicon dioxide, silicon nitride, silicon oxynitride, borophosphosilicate glass (BPSG), phosphosilicate glass (PSG), boron silicate glass (BSG), undoped silicate glass (USG), or any other suitable interlayer dielectric material.

Each of the embodiments 100A-D of the first semiconductor structure can further comprise multiple contacts that extend through the interlayer dielectric material 190 to various components of the FETs 191-192 (e.g., to the source/drain regions 112(*a*)-(*b*) and 114(*a*)-(*b*) (as illustrated), to the first gate 121 and additional gate 123 (not shown), etc.). For the first FET 191, the source/drain contacts can comprise a first source/drain contact 131 on the first source/drain region 112(*a*) and a second source/drain contact 132 on the second source/drain region 112(*b*). For the second FET 192, the source/drain contacts can comprise an additional first source/drain contact 133 on the additional first source/drain region 114(*a*) and an additional second source/drain contact 134 on the additional second source/drain region 114(*b*). The second source/drain contact 132 can be wider than the first source/drain contact 131 (i.e., the first source/drain contact 131 can have a width 171 and the second source/drain contact 132 can have a width 172 that is greater than the width 171 of the first source/drain contact 131). Thus, the second source/drain contact 132 can have lower resistance than the first source/drain contact 131 in the first FET 191. Similarly, the additional second source/drain contact 134 can be wider than the additional first source/drain contact 133. For example, the additional first source/drain contact 133 can have the same width as the first source/drain contact 131 and the additional second source/drain contact 134 can have the same width as the second source/drain contact 132. Thus, in the second FET 192, the additional second source/drain contact 134 can have a lower resistance than the additional first source/drain contact 133.

The second source/drain contact 132 can further be closer to the second gate 122 than it is to the first gate 121. Specifically, as shown in the embodiments 100A of FIGS. 1A-1B and 100B of FIGS. 2B-2B, the second source/drain contact 132 can be separated from the first gate 121 by a first distance 151 and can be separated from the second gate 122 by a second distance 152 that is less than the first distance 151. Alternatively, as shown in the embodiments 100C of FIGS. 3A-3B and 100D of FIGS. 4A-4B), the second source/drain contact 132 can be separated from the first gate 121 by the first distance 151 and can actually extend laterally onto the second gate 122. In either case, the first source/drain contact 131 can be separated from the first gate 121 by some distance (referred to herein as the third distance 153), which is either approximately equal to the first distance 151 (see the embodiment 100A of FIGS. 1A-1B or the embodiment 100C of FIGS. 3A-3B) or less than that first distance 151 (see the embodiment 100B of FIGS. 2B-2B or 100D of FIGS. 4A-4B). The additional first and second source/drain contacts 133-134 can be similarly positioned such that the first FET 191 and second FET 192 are essentially symmetrical.

Figure 2A:
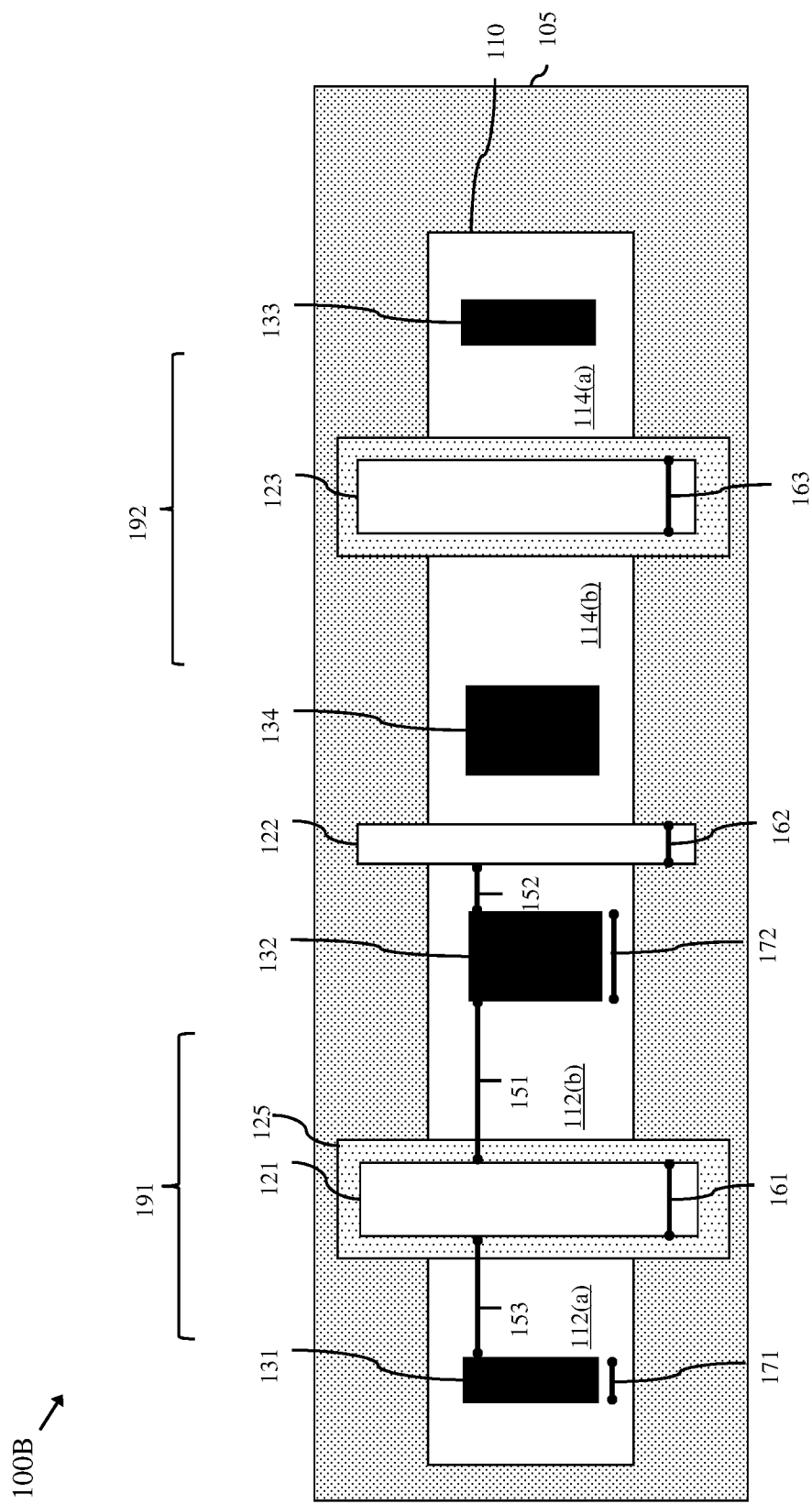
FIGS. 2A and 2B are top view and cross-section diagrams, respectively, of another embodiment of the first semiconductor structure.
Figure 4A:
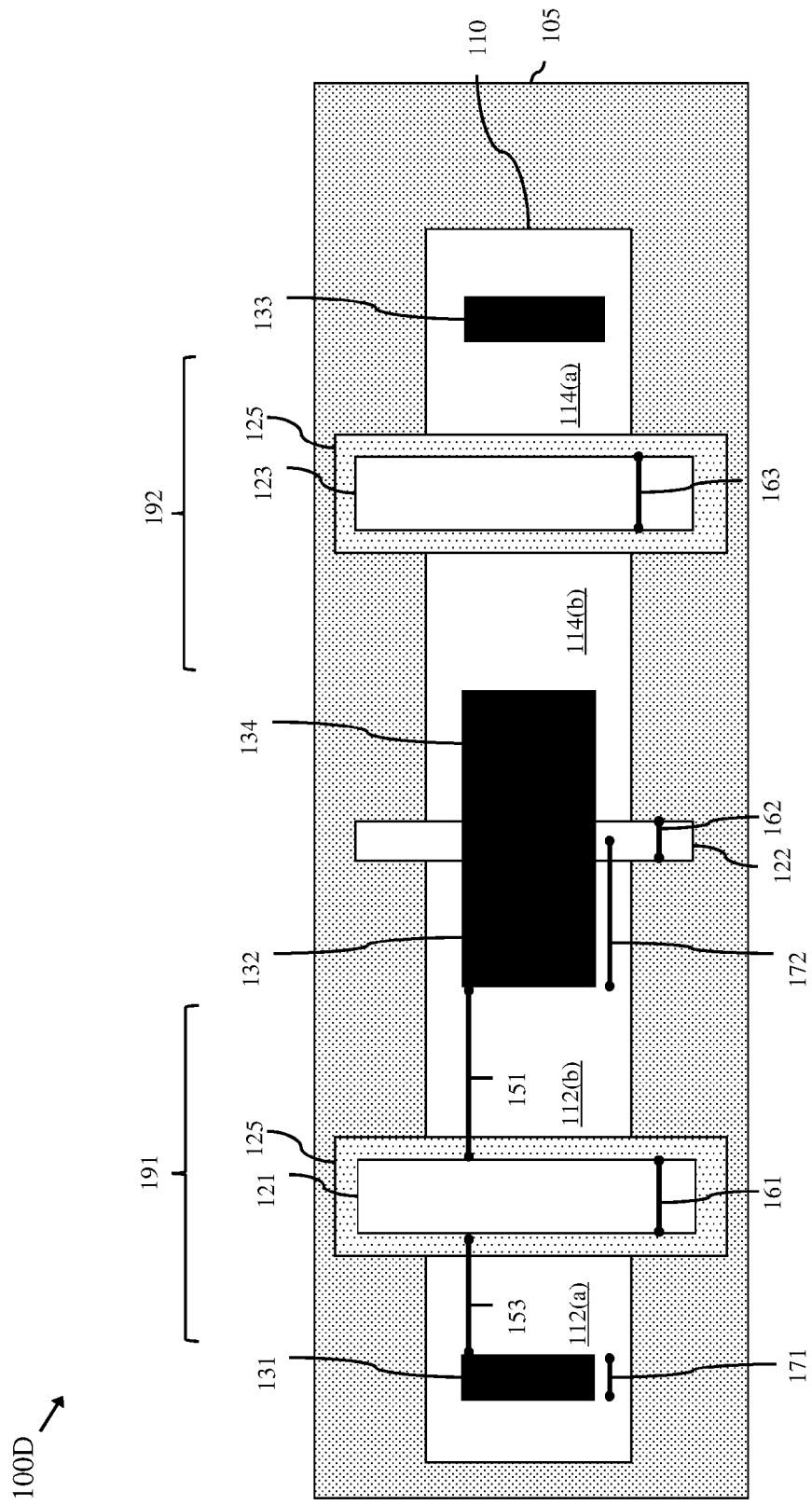
FIGS. 4A and 4B are top view and cross-section diagrams, respectively, of yet another embodiment of the first semiconductor structure.
Figure 4B:
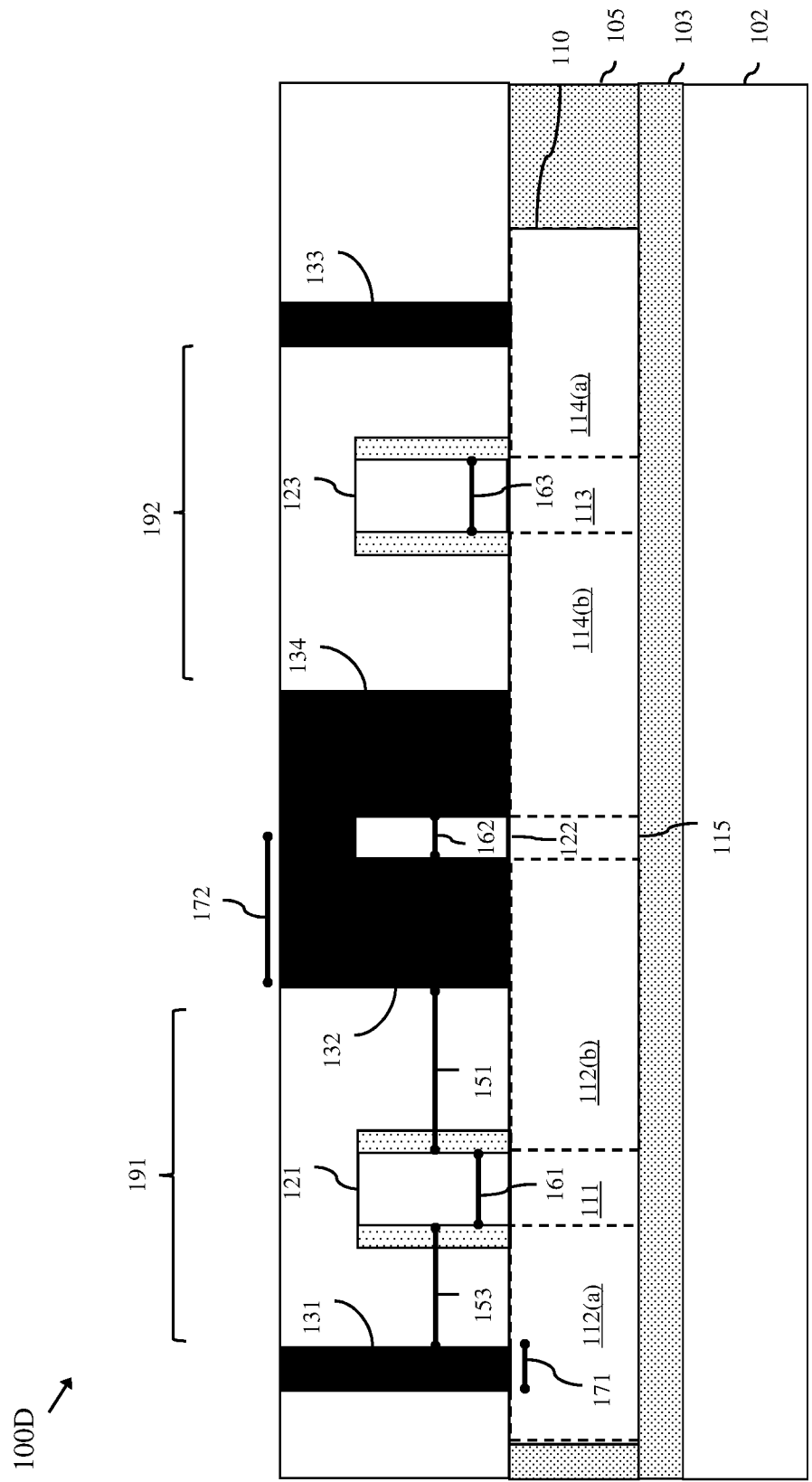

Placement of the first and second source/drain contacts 131-132 relative to the first gate 121 and placement of the second source/drain contact 132 relative to the second gate 122, as described above, ensures the first gate-to-second source/drain contact capacitance in the first FET 191 will be approximately equal to the first gate-to-first source/drain contact capacitance (see embodiments 100A of FIGS. 1A-1B and 100C of FIGS. 3A-3B) or less than the first gate-to-first source/drain contact capacitance (see embodiments 100B of FIGS. 2A-2B and 100D of FIGS. 4A-4B). Since the second FET 192 is essentially symmetrical to the first FET 191, the additional gate-to-additional second source/drain contact capacitance in the second FET 192 will similarly be equal to or less than the additional gate-to-additional first source/drain contact capacitance.

It should be noted that in the embodiment 100C of FIGS. 3A-3B, the second source/drain contact 132 and additional second source/drain contact 134 each extend laterally onto the second gate 122 (i.e., the non-functioning gate), but remain as discrete contact structures. In this case, the FETs 191-192 can comprise the same type FETs or different type FETs and the second source/drain region 112(b) and the additional second source/drain region 114(b) can comprise both source regions, both drain regions or a source region and a drain region. Alternatively, in the embodiment 100D of FIGS. 4A-4B, the second source/drain contact 132 and additional second source/drain contact 134 can each extend laterally onto the second gate 122 (i.e., onto the non-functioning gate) and can be merged above the second gate 122. In this case, the FETs 191-192 can comprise the same type FETs and both the second source/drain region 112(b) and the additional second source/drain region 114(b) should comprise source regions or drain regions.

Referring specifically to FIGS. 5A-5B and 6A-6B, each of the embodiments 200A-B of the second semiconductor structure can comprise a semiconductor body 210 for the first FET 291 and an additional semiconductor body 215 for the second FET 292. The semiconductor body 210 and the additional semiconductor body 215 can be in end-to-end alignment (i.e., the end 207 of the semiconductor body 210 can be adjacent to and aligned with the end 208 of the semiconductor body 215). As illustrated, the semiconductor body 210 and the additional semiconductor body 215 can comprise essentially rectangular-shaped planar semiconductor bodies for planar FETs. Such planar semiconductor bodies can be defined by a shallow trench isolation (STI) region 205 in the semiconductor layer above the insulator layer 203 in an SOI structure (or in the upper portion of the substrate in a bulk semiconductor structure). The STI region 205 can laterally surround each of the semiconductor bodies 210 and 215. Thus, the end 207 of the semiconductor body 210 and the end 208 of the additional semiconductor body 215 will be separated by the isolation region 205. Although not shown, the semiconductor bodies 210 and 215 can, alternatively, comprise essentially rectangular-shaped non-planar semiconductor bodies (also referred to herein as a semiconductor fins) for multi-gate non-planar field effect transistor(s) (e.g., dual-gate FETs, also referred to herein as fin-type FETs, and tri-gate FETs). Non-planar semiconductor bodies can be defined (e.g., patterned and etched) from the semiconductor layer above the insulator layer 203 in an SOI structure (or in the upper portion of the substrate in a bulk semiconductor structure).

In each of the embodiments 200A-B of the second semiconductor structure, the semiconductor body 210 can comprise at least the following components of the first FET 291: a first source/drain region 212(a); a second source/drain region 212(b) at one end 207 and, particularly, at the end 207 adjacent to the isolation region 205 opposite the end 208 of the additional semiconductor body 215; and a channel region 211 positioned laterally between the first source/drain region 112(a) and the second source/drain region 212(b). Similarly, the additional semiconductor body 210 can comprise at least the following components of the optional second FET 292: an additional first source/drain region 214(a); an additional second source/drain region 214(b) at one end 208 of the additional semiconductor body 215 and, particularly, at the end 208 adjacent to the isolation region 205 and opposite the end 207 of the semiconductor body 210; and an additional channel region 213 positioned laterally between the additional first source/drain region 214(a) and the additional second source/drain region 214(b). Although not shown, the semiconductor bodies 210 and 215 can each, optionally, comprise one or more additional components for the FETs 291 and 292 including, but not limited to, halo region(s) and source/drain extension region(s). Such regions are well known in the art and, thus, the details thereof are omitted from this specification in order to allow the reader to focus on the salient aspects of the disclosed semiconductor structures.

Each of the embodiments 200A-B of the second semiconductor structure can further comprise multiple gates. The multiple gates can comprise a first gate 221 for the first FET 291 adjacent to the semiconductor body 210 at the channel region 211; and a second gate 222, which is a non-functioning gate (i.e., an inactive gate), adjacent to the semiconductor body 210 at the interface between the isolation region 205 and the second source/drain region 212(b) such that the second source/drain region 212(b) is between the first gate 221 and the second gate 122. Additionally, the multiple gates can comprise an additional first gate 223 for the second FET 292 adjacent to the additional semiconductor body 215 at the additional channel region 213; and an additional second gate 224, which is a also a non-functioning gate, positioned adjacent to the additional semiconductor body 215 at the interface between the isolation region 205 and the additional second source/drain region 214(b) such that the additional second source/drain region 214(b) is between the additional first gate 223 and the additional second gate 224.

The multiple gates (i.e., the first gate 221 of the first FET 291; the non-functioning second gate 222; the additional first gate 223 of the second FET 292; and the non-functioning additional second gate 224) can have an approximately uniform pitch. The multiple gates can further all have the same gate length. That is, the length 261 of the first gate 221, the length 262 of the second gate 222 and the lengths 263 and 264 of the additional first and second gates 223 and 224, respectively, can all be approximately equal, as shown in the embodiment 200A of FIGS. 5A-5B. Alternatively, the functioning and non-functioning gates can have different lengths. That is, the length 261 of the first gate 221 of the first FET 291 and the length 263 of the additional first gate 223 of the second FET 292 (i.e., the lengths of the functioning gates of the first FET 291 and second FET 292) can be greater than the length 262 of the second gate 222 and the length 264 of the additional second gate 224 (i.e., than the lengths of the non-functioning gates), as shown in embodiments 200B of FIGS. 6A-6B.

Figure 5A:
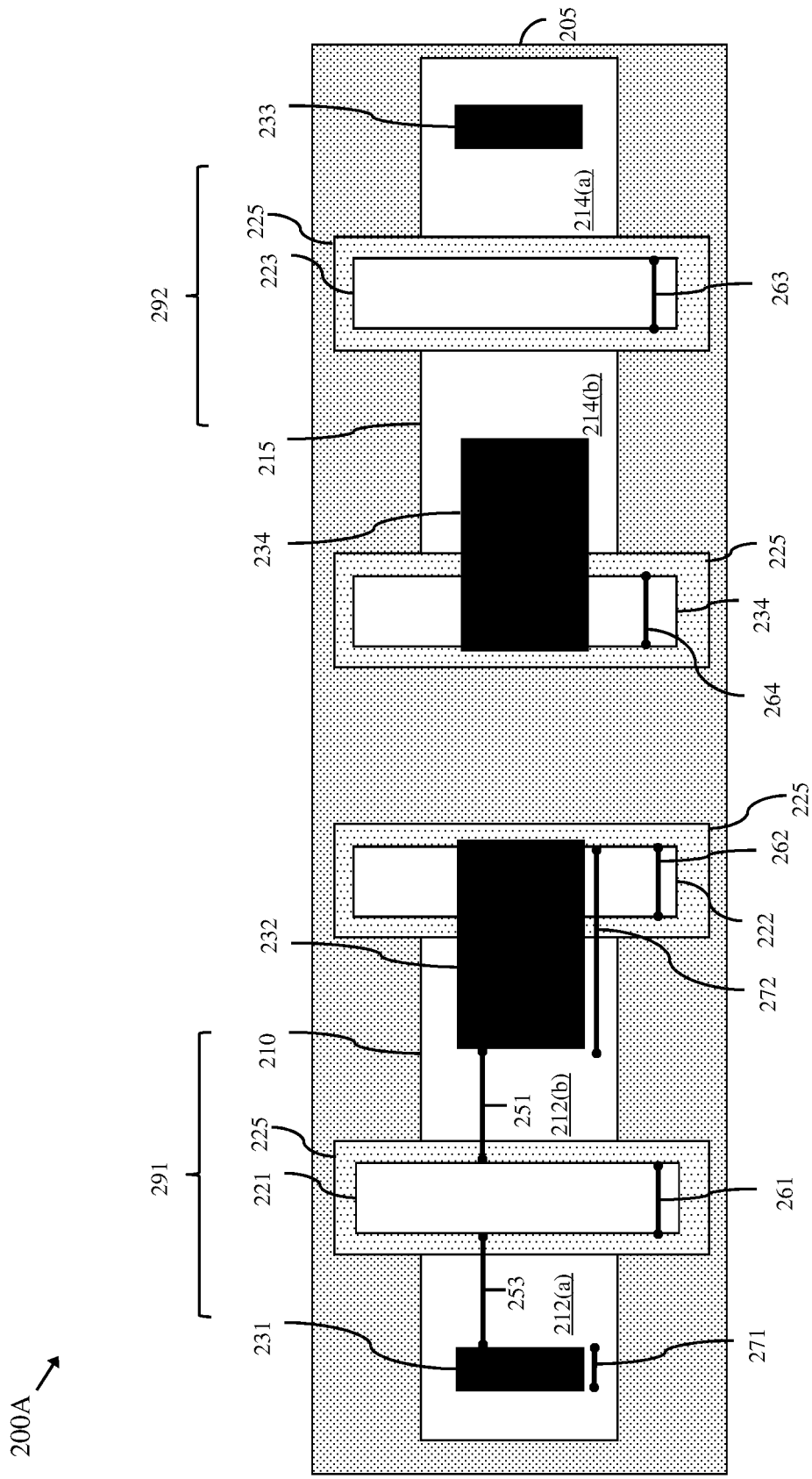
FIGS. 5A and 5B are top view and cross-section diagrams, respectively, of an embodiment of a second semiconductor structure comprising at least one FET having a low-resistance source/drain contact.
Figure 5B:
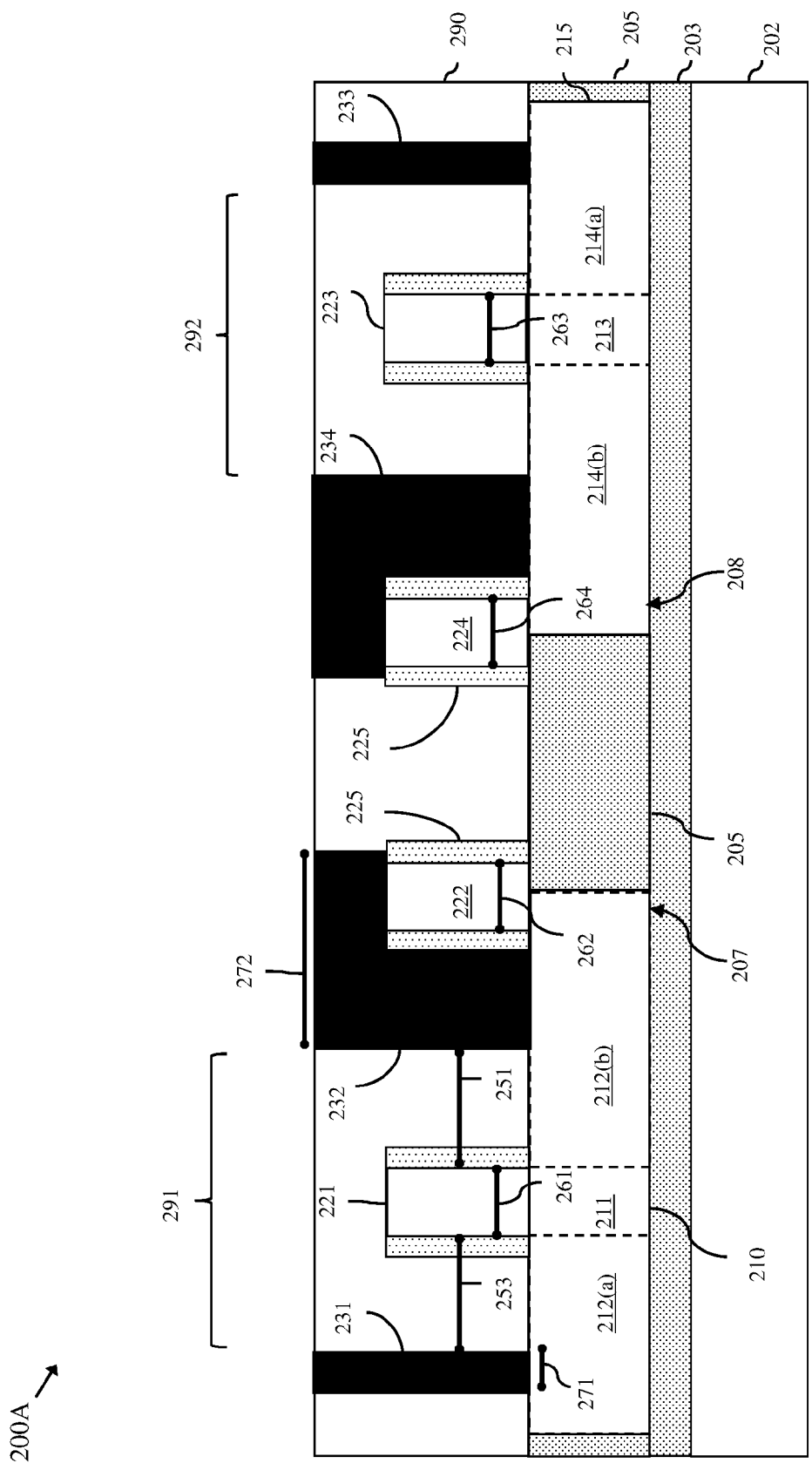

Gate sidewall spacers 225 (e.g., silicon nitride gate sidewall spacers) can be positioned adjacent to the sidewalls of all of the multiple gates, as shown in embodiment 200A of FIGS. 5A-5B. Alternatively, the non-functioning gates can be devoid of such gate sidewall spacers. That is, only the first gate 221 of the first FET 291 and the additional first gate 223 of the optional second FET 292 (i.e., the functioning gates of the FETs 291-292) can have gate sidewall spacers 225, as shown in the embodiment 200B of FIGS. 6A-6B.

Each of the embodiments 200A-B of the second semiconductor structure can further comprise interlayer dielectric material 290 covering the multiple gates, covering the portions of the semiconductor bodies 210 and 215 adjacent to the gates (i.e., on the first and second source/drain regions 212(a)-(b) and on the additional first and second source/drain regions 214(a)-(b)) and covering the isolation region 205 surrounding the semiconductor bodies 210 and 215. The interlayer dielectric material can comprise, for example, one or more layers of any of the following: silicon dioxide, silicon nitride, silicon oxynitride, borophosphosilicate glass (BPSG), phosphosilicate glass (PSG), boron silicate glass (BSG), undoped silicate glass (USG), or any other suitable interlayer dielectric material.

Each of the embodiments 200A-B of the second semiconductor structure can further comprise multiple contacts that extend through the interlayer dielectric material to various components of the FETs 291 and 292 (e.g., to the source/drain regions 212(a)-(b) and 214(a)-(b) (as illustrated), to the first gate 221 and additional first gate 223 (not shown), etc.). For the first FET 291, the source/drain contacts can comprise a first source/drain contact 231 on the first source/drain region 212(a) and a second source/drain contact 232 on the second source/drain region 212(b). For the second FET 292, the source/drain contacts can comprise an additional first source/drain contact 233 on the additional first source/drain region 214(a) and an additional second source/drain contact 234 on the additional second source/drain region 214(b). The second source/drain contact 232 can be wider than the first source/drain contact 231 (i.e., the first source/drain contact 231 can have a width 271 and the second source/drain contact 232 can have a width 272 that is greater than the width 271 of the first source/drain contact 231). Thus, the second source/drain contact 232 can have lower resistance than the first source/drain contact 231 in the first FET 291. Similarly, the additional second source/drain contact 234 can be wider than the additional first source/drain contact 233. For example, the additional first source/drain contact 233 can have the same width as the first source/drain contact 231 and the additional second source/drain contact 234 can have the same width as the second source/drain contact 232. Thus, in the second FET 292, the additional second source/drain contact 234 can have a lower resistance than the additional first source/drain contact 233.

The second source/drain contact 232 can further be closer to the second gate 222 than it is to the first gate 221. Specifically, the second source/drain contact 232 can be separated from the first gate 221 by a distance 251 (referred to herein as the first distance) and can actually extend laterally onto the second gate 222. The first source/drain contact 231 can be separated from the first gate 221 by some distance (referred to herein as the third distance 253), which is either approximately equal to the first distance 251 (see the embodiment 200A of FIGS. 5A-5B) or less than that first distance 251 (see the embodiment 200B of FIGS. 6A-6B). The additional first and second source/drain contacts 233-234 can be similarly positioned such that the first FET 291 and second FET 292 are essentially symmetrical.

Figure 6A:
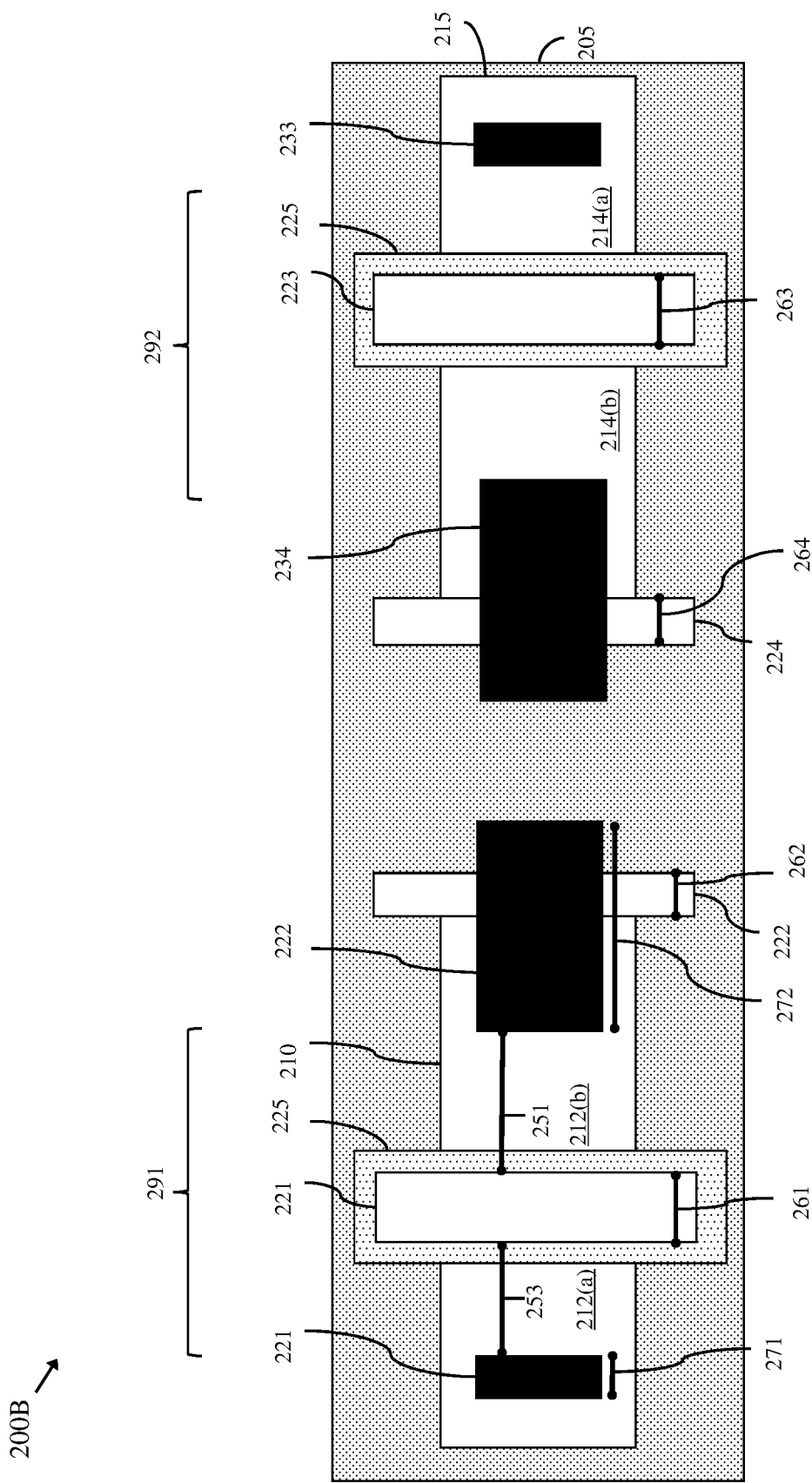
FIGS. 6A and 6B are top view and cross-section diagrams, respectively, of another embodiment of the second semiconductor structure.
Figure 6B:
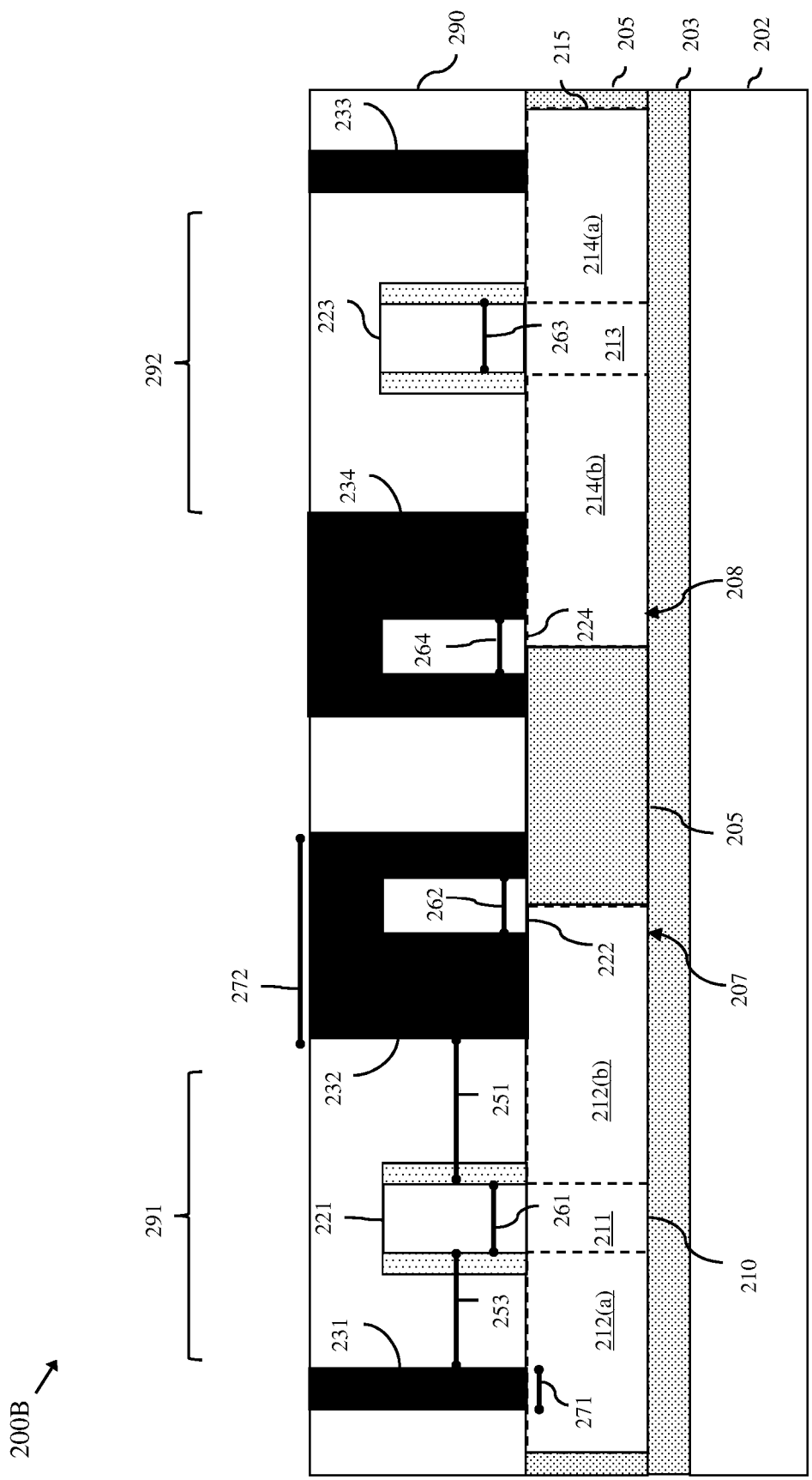

Placement of the first and second source/drain contacts 231-232 relative to the first gate 221 and placement of the second source/drain contact 232 relative to the second gate 222, as described above, ensures the first gate-to-second source/drain contact capacitance in the first FET 291 will be approximately equal to the first gate-to-first source/drain contact capacitance (see embodiments 200A of FIGS. 5A-5B) or less than the first gate-to-first source/drain contact capacitance (see embodiment 200B of FIGS. 6A-6B). Since the second FET 292 is essentially symmetrical to the first FET 291, the additional first gate-to-additional second source/drain contact capacitance in the second FET 292 will similarly be equal to or less than the additional first gate-to-additional first source/drain contact capacitance.

It should be understood that in the embodiments 100A-D of the first semiconductor structure illustrated in FIGS. 1A-1B, 2B-2B, 3A-3B and 4A-4B and in the embodiments 200A-B of the second semiconductor structure illustrated in FIGS. 5A-5B and 6A-6B the first FET 191, 291 can be a first type FET, wherein the source/drain regions 112(a)-(b), 212(a)-(b) have a first type conductivity at a relatively high conductivity level and the channel region 111, 211 has, for example, a second type conductivity that is different from the first type conductivity. It should be noted that the first type conductivity and the second type conductivity would vary depending upon whether the first FET 191, 291 is an N-type FET or a P-type FET. For example, for an N-type FET, the first type conductivity of the source/drain regions can be N-type conductivity and the second type conductivity (e.g., of the channel region) can be P-type conductivity, whereas, for a P-type FET, the first type conductivity of the source/drain regions can be P-type conductivity and the second type conductivity (e.g., of the channel region) can be N-type conductivity. Those skilled in the art will recognize that different dopants can be used to achieve the different type conductivities (i.e., P-type conductivity and N-type conductivity) and that those dopants will vary depending upon the different semiconductor materials used. For example, a silicon-based semiconductor material can be doped with arsenic (As), phosphorous (P) or antimony (Sb) so as to have N-type conductivity or can be doped with boron (B), boron difluoride ($BF_2$) or indium (In) so as to have P-type conductivity. In another example, a gallium arsenide (GaAs) or gallium nitride (GaN)-based semiconductor material can be doped with silicon (Si) so as to have N-type conductivity or can be doped with magnesium (Mg) or beryllium (Be) so as to have P-type conductivity. Additionally, those skilled in the art will also recognize that the higher the concentration of the particular dopant used, the higher the conductivity level associated with that dopant and vice versa. Furthermore, the different conductivity types and levels will depend upon the relative concentration levels of different type dopants in the same region. The second FET 192, 292 can similarly be a first type FET. Alternatively, the second FET 192, 292 can be a second type FET, wherein the additional source/drain regions 114(*a*)-(*b*), 214(*a*)-(*b*) have the second type conductivity at a relatively high conductivity level and the additional channel region 113, 213 has, for example, the first type conductivity.

It should further be understood that in the embodiments 100A-D of the first semiconductor structure illustrated in FIGS. 1A-1B, 2B-2B, 3A-3B and 4A-4B and in the embodiments 200A-B of the second semiconductor structure illustrated in FIGS. 5A-5B and 6A-6B the difference between functioning gates (e.g., the first gate 121 of the first FET 191 and the additional gate 123 of the second FET 192 in the embodiments 100A-D or the first gate 221 of the first FET 291 and the additional first gate 223 of the second FET 292 in the embodiments 200A-B) and non-functioning gates (e.g., the second gate 122 in the embodiments 100A-D or the second gate 222 and the additional second gate 224 in the embodiments 200A-B) is that each functioning gate is contacted and electrically connected to a power supply or other device, which can selectively apply a voltage to the gate in order to alter current flow in the adjacent channel (i.e., to selectively turn on or off the FET, depending upon the conductivity type of the transistor). Each non-functioning gate is specifically not connected to a power supply or other device (i.e., is not contacted) and, thus, remains permanently inactive and unable to alter current flow within the adjacent semiconductor body.

The functioning gates and the non-functioning gates described above can have essentially identical compositions. That is, they can comprise the same gate stack materials (i.e., the same gate dielectric layer(s) and gate conductor layer(s)). For example, the functioning gates and the non-functioning gates can all comprise conventional gates comprising, for example, a silicon dioxide gate dielectric layer and a polysilicon gate conductor layer on the silicon dioxide gate dielectric layer. Alternatively, the functioning gates and non-functioning gates can all comprise replacement metal gates comprising, for example, a high-K gate dielectric layer and one or more metal layers on the high-K gate dielectric layer. Those skilled in the art will recognize that a "replacement metal gate" refers to a metal gate that, during processing, replaces a previously formed and selectively removed dummy gate (also referred to herein as a sacrificial gate), which served as a placeholder for the metal gate. Alternatively, the functioning gates and non-functioning gates described above can have different compositions. For example, the functioning gates can comprise replacement metal gates, as described above, and the non-functioning gates can comprise dummy gates. The dummy gates can comprise, for example, patterned semiconductor (e.g., silicon, polysilicon, amorphous silicon, etc.) shapes or dielectric shapes, which, as mentioned above, typically serve as placeholders for replacement metal gates. Conventional gates, replacement metal gates, and dummy gates that are formed as placeholders for replacement metal gates are well known in the art and, thus, details of such gates are omitted from this specification in order to allow the reader to focus on the salient aspects of the disclosed semiconductor structures.

Figure 7:
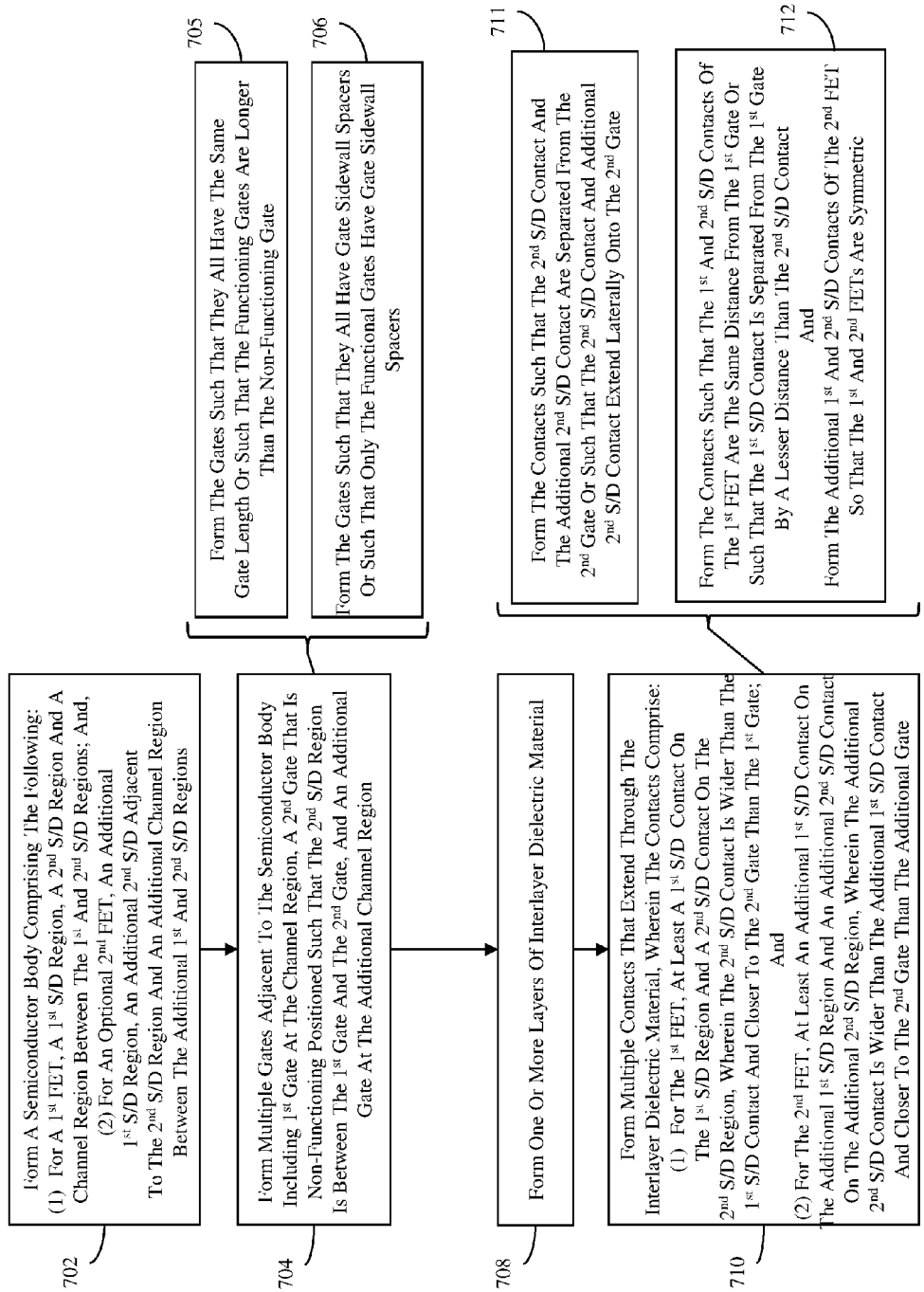
FIG. 7 is a flow diagram illustrating a method of forming the embodiments of the first semiconductor structure.

Referring to FIG. 7, also disclosed herein is a method of forming the embodiments 100A-D of the first semiconductor structure, which are described in detail above and illustrated in FIGS. 1A-1B, 2B-2B, 3A-3B and 4A-4B and which comprise a first field effect transistor (FET) 191 and an optional second FET 192. For purposes of illustration, this method is described below and shown in the Figures as including formation of the optional second FET 192.

Figure 8:
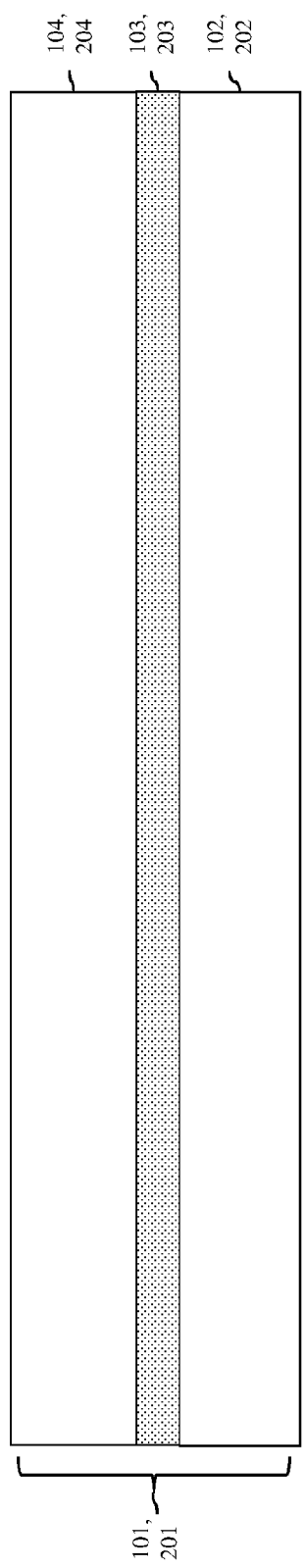
FIG. 8 is a cross-section diagram illustrating a partially completed semiconductor structure formed according to the method of FIG. 7 above or the method of FIG. 10 below.

The method can comprise providing a wafer 101 (see FIG. 8). The wafer 101 can comprise a semiconductor-on-insulator (SOI) wafer comprising, for example, a semiconductor substrate 102 (e.g., a silicon substrate or any other suitable semiconductor substrate, such as a germanium substrate, a gallium arsenide substrate, a gallium nitride substrate, etc.), an insulator layer 103 (e.g., a silicon dioxide layer, a silicon nitride layer, a silicon oxynitride layer or any other suitable insulator layer) on the semiconductor substrate 102 and a semiconductor layer on the insulator layer 103. Alternatively, the wafer 101 can comprise a bulk semiconductor wafer comprising, for example, a bulk semiconductor substrate (e.g., a bulk silicon substrate or any other suitable bulk semiconductor structure (e.g., a bulk germanium substrate, a bulk gallium arsenide substrate, a bulk gallium nitride substrate, etc.). Optionally, in the case of a bulk semiconductor wafer, a dopant implantation process can be performed in order to form a buried well region that isolates the upper portion of the substrate from the lower portion of the substrate.

Figure 9:
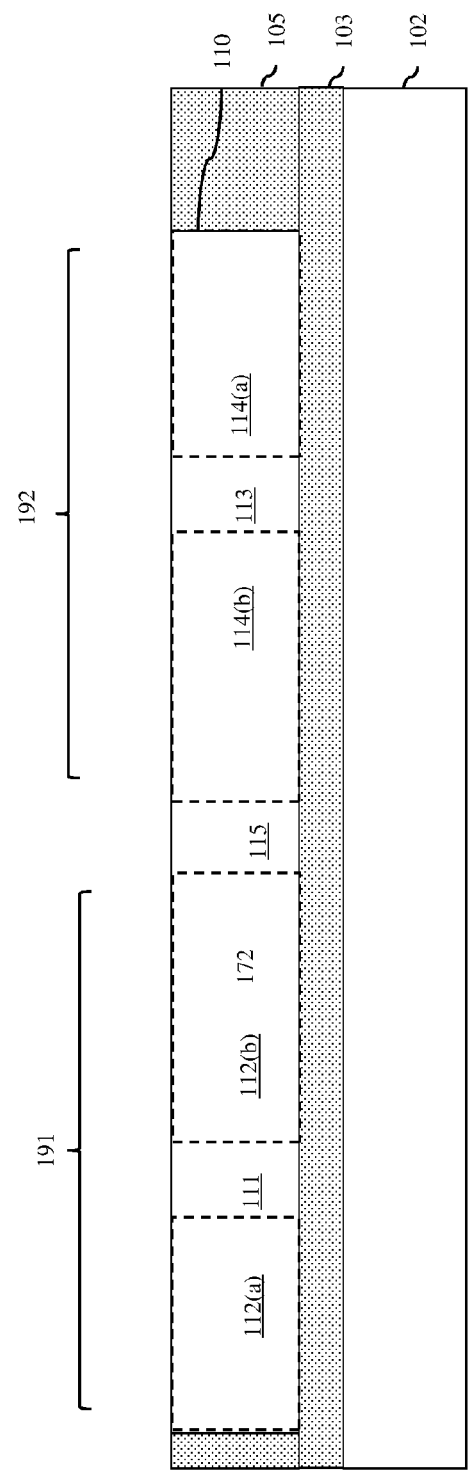
FIG. 9 is a cross-section diagram illustrating a partially completed semiconductor structure formed according to the method of FIG. 7 above.

The method can further comprise forming, on the wafer 101, a semiconductor body 110 for one or more FETs 191, 291 (702). To form a semiconductor body for planar FET(s), a shallow trench isolation (STI) region 105 can be formed (e.g., using conventional STI formation techniques) in the semiconductor layer 104 above the insulator layer 103 (or in the upper portion of a bulk semiconductor substrate, if applicable) such that the isolation region 105 defines the shape of an essentially rectangular-shaped planar semiconductor body and, thereby laterally surrounds that semiconductor body, as shown in FIG. 9. Although not shown, to form a semiconductor body for multi-gate non-planar FET(s) (e.g., dual-gate FETs, also referred to herein as fin-type FETs, and tri-gate FETs), an essentially rectangular-shaped non-planar semiconductor body (also referred to herein as a semiconductor fin) can be formed (e.g., using conventional lithographic or sidewall image transfer (SIT) patterning and etch techniques) from the semiconductor layer 104 above the insulator layer 103 (or from the upper portion of a bulk semiconductor structure, if applicable).

In any case, as shown in FIG. 9, this semiconductor body 110 can comprise at least the following components of the first FET 191: a first source/drain region 112(*a*); a second source/drain region 112(*b*); and a channel region 111 positioned laterally between the first source/drain region 112(*a*) and the second source/drain region 112(*b*). The semiconductor body 110 can further comprise the following components of the second FET 192: an additional first source/drain region 114(*a*); an additional second source/drain region 114(*b*); and an additional channel region 113 positioned laterally between the additional first source/drain region 114(*a*) and the additional second source/drain region 114(b). The additional second source/drain region 114(b) of the second FET 192 can be positioned adjacent to the second source/drain region 112(b) of the first FET 191. A well region 115 can be positioned laterally between and can physical separate the second source/drain region 112(b) from the additional second source/drain region 114(b). This well region 115 can, for example, have the same type conductivity as the channel region 111. Although not shown, the semiconductor body 110 can, optionally, comprise one or more additional components for one or both of the FETs 191 and 192 including, but not limited to, halo region(s) and source/drain extension region(s). Such regions are well known in the art and, thus, the details thereof are omitted from this specification in order to allow the reader to focus on the salient aspects of the disclosed semiconductor structures.

It should be understood that, as in conventional FET processing, doping processes used to achieve desired conductivity types and levels in any of the regions described above (i.e., in the channel regions 111, 113, well region 115, S/D regions 112(a)-(b), 114(a)-(b), S/D extension region(s), and halo region(s)) may occur at various different times during processing (e.g., before gate formation; after gate formation, but before sidewall spacer formation; etc.). Such doping processes are well known in the art and, thus, the details are omitted from this specification in order to allow the reader to focus on the salient aspects of the disclosed method.

The method can further comprise forming multiple gates (704). Specifically, as shown in FIGS. 1A-1B, 2B-2B, 3A-3B and 4A-4B, the following gates can be formed at process 704: a first gate 121 for the first FET 191 adjacent to the semiconductor body 110 at the channel region 111; a second gate 122 and, particularly, a gate that will be non-functioning gate in the resulting semiconductor structure (i.e., that will be an inactive gate) adjacent to the semiconductor body 110 such that the second source/drain region 112(b) is between the first gate 121 and the second gate 122; and an additional gate 123 for the second FET 192 at the additional channel region 113.

These gates can be formed and, particularly, patterned at process 704 so as to have an approximately uniform pitch. These gates can further be formed and, particularly, patterned so that they all have the same gate length or so that the functioning and non-functioning gates have different lengths (705). That is, the gates can be formed such that the length 161 of the first gate 121, the length 162 of the second gate 122 and the length 163 of the additional gate 123 are all be approximately equal, as shown in the embodiments 100A of FIGS. 1A-1B and 100C of FIGS. 3A-3B. Alternatively, they can be formed such that the length 161 of the first gate 121 and the length 163 of the additional gate 123 (i.e., the lengths of the functioning gates) are greater than the length 162 of the second gate 122 (i.e., the length of the non-functioning gate), as shown in embodiments 100B of FIGS. 2B-2B and 100D of FIGS. 4A-4B.

The gates can be formed at process 704 using, for example, conventional gate processing techniques such that all of the gates (i.e., the first gate 121 of the first FET 191, the second gate 122 and the additional gate 123 of the second FET 192) have the same composition. For example, they can be formed as conventional gates. That is, one or more gate dielectric layers (e.g., a silicon oxide gate dielectric layer) can deposited over the semiconductor body 110 and one or more gate conductor layers (e.g., a polysilicon gate conductor layer) can be deposited over the gate dielectric layer(s). The stack of gate dielectric and gate conductor layers can then be lithographically patterned and etch to form multiple conventional gates, having the gate pitch, gate lengths, etc., as described above. Next, gate sidewall spacers 125 (e.g., silicon nitride gate sidewall spacers) can be formed on the sidewalls of the gates (e.g., using conventional sidewall spacer formation techniques).

Alternatively, the gates can be formed at process 704 using, for example, replacement metal gate processing techniques such that all of the gates (i.e., the first gate 121 of the first FET 191, the second gate 122 and the additional gate 123 of the second FET 192) have comprise replacement metal gates or such that the first gate 121 and additional gate 123 (i.e., the functioning gates) comprise replacement metal gates and the second gate 122 (i.e., the non-functioning gate) comprises a dummy gate. That is, a blanket layer of a dummy gate material (e.g., a semiconductor material, such as silicon, polysilicon, or amorphous silicon, or a dielectric material) can be deposited over the semiconductor body 110. This blanket layer can be lithographically patterned and etched to form multiple dummy gates. The multiple dummy gates can have the same positions, gate pitch, gate lengths, etc. as required for the first gate 121, second gate 122 and additional gate 123. Next, gate sidewall spacers 125 (e.g., silicon nitride gate sidewall spacers) can be formed on the sidewalls of the dummy gates (e.g., using conventional sidewall spacer formation techniques). Following gate sidewall spacer formation, one or more layers of interlayer dielectric material 190 can be deposited over the dummy gates and planarized to expose the top surfaces of the dummy gates. The interlayer dielectric material can comprise, for example, one or more layers of any of the following: silicon dioxide, silicon nitride, silicon oxynitride, borophosphosilicate glass (BPSG), phosphosilicate glass (BPSG), boron silicate glass (BSG), undoped silicate glass (USG), or any other suitable interlayer dielectric material. Next, either all of the dummy gates or only the dummy gates corresponding to the first gate 121 and additional gate 123 (i.e., corresponding to the functioning gates for the FETs 191-192) can be selectively removed, creating openings in the interlayer dielectric material that are lined with gate sidewall spacers 125. It should be noted that the dummy gate material, sidewall spacer material and interlayer dielectric material should be different materials so as to allow the dummy gates to be selectively removed. Replacement metal gates are formed in these openings by depositing a conformal high-K gate dielectric layer and, then, forming one or more metal layers on the high-K gate dielectric layer.

It should be noted that in the embodiments 100A of FIGS. 1A-1B and 100C of FIGS. 3A-C all of the gates are laterally surrounded by gate sidewall spacers 125 (e.g., silicon nitride gate sidewall spacers). However, in the embodiments 100B of FIGS. 2B-2B and 100D of FIGS. 4A-4B only the first gate 121 of the first FET 191 and the additional gate 123 of the second FET 192 (i.e., the functioning gates) have gate sidewall spacers 125 and the second gate 122 (i.e., the non-functioning gate) is devoid of such a gate sidewall spacer. To achieve the embodiments 100A or 100C, all the gates can be formed, as described above, so as to have gate sidewall spacers or, alternatively, to achieve the embodiments 100B or 100D, the second gate 122 can be masked during gate sidewall spacer formation or any gate sidewall spacer material formed on the second gate 122 during gate sidewall spacer formation can be removed (706).

Following formation of the multiple gates, one or more layers of interlayer dielectric material 190 can be deposited so as to cover the multiple gates and any exposed portions of the semiconductor body 110 adjacent to those gates (i.e., any exposed source/drain regions 112(a)-(b), 114(a)-(b)) (708). The interlayer dielectric material can comprise, for example, one or more layers of any of the following: silicon dioxide, silicon nitride, silicon oxynitride, borophosphosilicate glass (BPSG), phosphosilicate glass (BPSG), boron silicate glass (BSG), undoped silicate glass (USG), or any other suitable interlayer dielectric material.

Next, multiple contacts can be formed that extend through the interlayer dielectric material 190 to various components of the FETs 191-192 (e.g., to the source/drain regions 112(a)-(b) and 114(a)-(b) (as illustrated), to the first gate 121 and additional gate 123 (not shown), etc.) (710). For the first FET 191, the source/drain contacts can comprise a first source/drain contact 131 on the first source/drain region 112(a) and a second source/drain contact 132 on the second source/drain region 112(b). For the optional second FET 192, these contacts can comprise an additional first source/drain contact 133 on the additional first source/drain region 114(a); and an additional second source/drain contact 134 on the additional second source/drain region 114(b).

The contacts can be formed and, particularly, patterned at process 710 such that the second source/drain contact 132 is wider than the first source/drain contact 131 and, similarly, such that the additional second source/drain contact 134 is wider than the additional first source/drain contact 133. Thus, the second source/drain contact 132 will have lower resistance than the first source/drain contact 131 in the first FET 191 and the additional second source/drain contact 134 will have a lower resistance than the additional first source/drain contact 133 in the second FET 192.

Additionally, the contacts can be formed and, particularly, patterned at process 710 such that, in the first FET 191, the second source/drain contact 132 is closer to the second gate 122 than it is to the first gate 121. For example, the contacts can be formed such that the second source/drain contact 132 is separated from the first gate 121 by a first distance 151 and either is separated from the second gate 122 by a second distance 152, which is less than the first distance 151 (see the embodiments 100A and 100B of FIGS. 1A-1B and 2B-2B, respectively), or extends laterally onto the second gate 122 (see embodiments 100C and 100D of FIGS. 3A-3B and 4A-4B, respectively) (711). Furthermore, the contacts can be formed and, particularly, patterned such that the first source/drain contact 131 is separated from the first gate 121 by a third distance 153, which is either approximately equal to the first distance 151 (see the embodiments 100A and 100C of FIGS. 1A-1B and 3A-3B, respectively) or is less than that first distance 151 (see the embodiments 100B and 100D of FIGS. 2B-2B and 4A-4B, respectively) (712). The contacts can further be formed and, particularly, patterned such that the additional first and second source/drain contacts 133-134 in the optional second FET 192 are similarly positioned such that the FETs 191 and 192 are essentially symmetric.

The contacts can be formed at process 710, as described above, using, for example, damascene contact formation techniques, self-aligned contact formation techniques or any other suitable contact formation techniques. These techniques are well known in the art and, thus, the details have been omitted from this specification in order to allow the reader to focus on the salient aspects of the disclosed method.

Placement of the first and second source/drain contacts 131-132 relative to the first gate 121 and placement of the second source/drain contact 132 relative to the second gate 122 at process 710, as described above, ensures the first gate-to-second source/drain contact capacitance in the first FET 191 will be approximately equal to the first gate-to-first source/drain contact capacitance (see embodiments 100A of FIGS. 1A-1B and 100C of FIGS. 3A-3B) or less than the first gate-to-first source/drain contact capacitance (see embodiments 100B of FIGS. 2A-2B and 100D of FIGS. 4A-4B). Since the second FET 192 is essentially symmetrical to the first FET 191, the additional gate-to-additional second source/drain contact capacitance in the second FET 192 will similarly be equal to or less than the additional gate-to-additional first source/drain contact capacitance. Furthermore, reducing the length of the second gate 122 relative to the lengths of the first gate 121 and the additional gate 123 and/or removing the gate sidewall spacer from the second gate 122 (see the optional process steps described above), opens up more surface area of the semiconductor body 210 available for formation of the second source/drain contact 132 and the additional second source/drain contact 134 and, thereby allows the widths of those contacts 132 and 134 to be maximized to further reduce contact resistance without moving them closer to the gates 121 and 123, respectively, and, thereby without further increasing gate-to-source/drain contact capacitance.

It should be noted that, when the second source/drain contact 132 and additional second source/drain contact 134 are formed at process 710 so as to extend laterally onto the second gate 122 (i.e., the non-functioning gate), they should generally be patterned so as to form discrete contact structures. However, if the FETs 191-192 being formed comprise the same type FETs and the second source/drain region 112(b) and the additional second source/drain region 114(b) are either both source regions or both drain regions, then, optionally, the second source/drain contact 132 and the additional second source/drain contact 134 can be patterned so that they are merged into a single contact structure above the second gate 122, as shown in the embodiment 100D of FIGS. 4A-4B.

Figure 10:
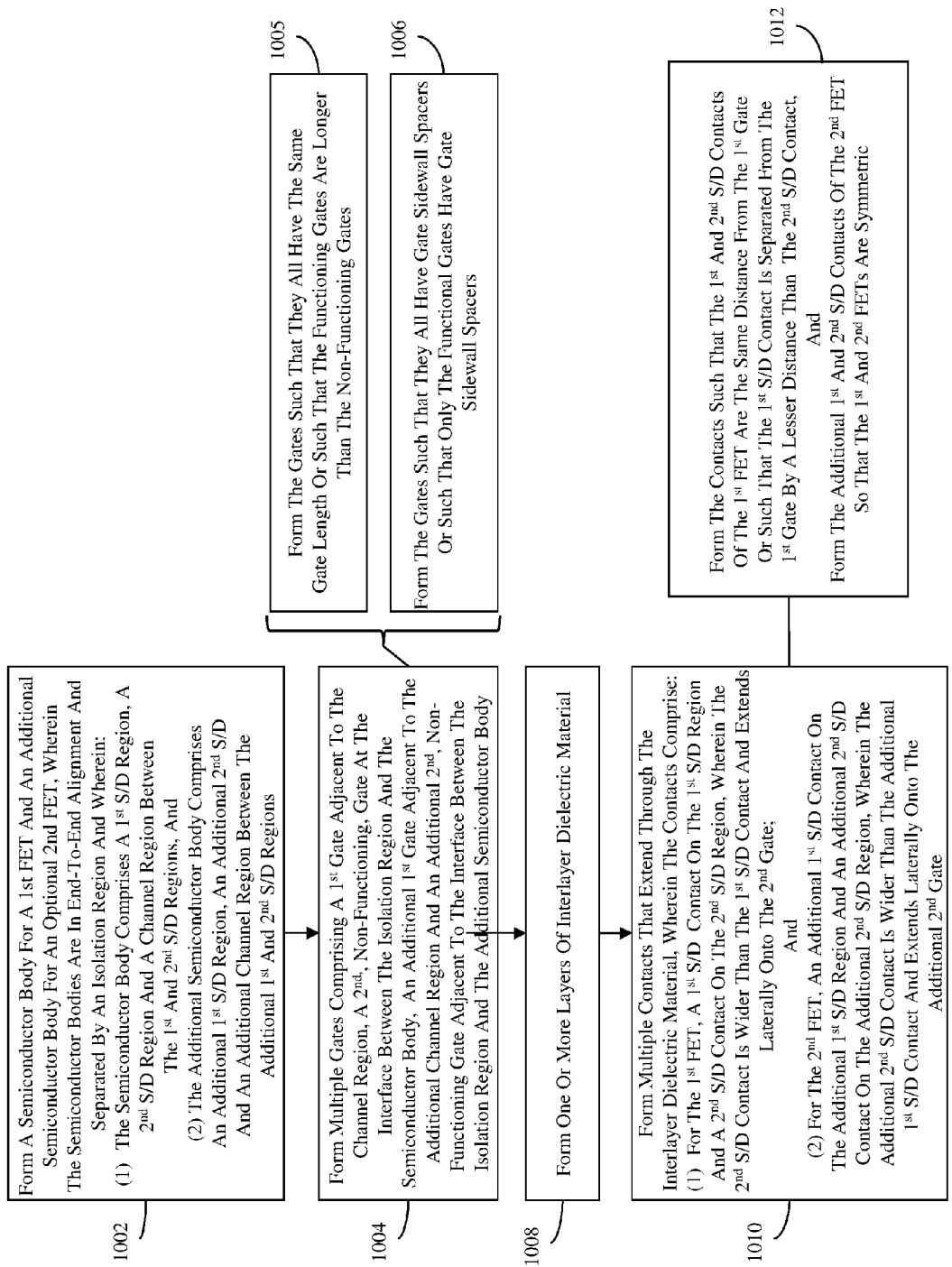
FIG. 10 is a flow diagram illustrating a method of forming the embodiments of the second semiconductor structure.

Referring to FIG. 10, also disclosed herein is a method of forming the embodiments 200A-B of the second semiconductor structure, which are described in detail above and illustrated in FIGS. 5A-5B and 6A-6B and which comprise a field effect transistor (FET) 291 and, optionally, a second FET 292. For purposes of illustration, the method is described below and shown in the Figures as including formation of the optional second FET 292.

The method can comprise providing a wafer 201 (see FIG. 8). The wafer 201 can comprise a semiconductor-on-insulator (SOI) wafer comprising, for example, a semiconductor substrate 202 (e.g., a silicon substrate or any other suitable semiconductor substrate, such as a germanium substrate, a gallium arsenide substrate, a gallium nitride substrate, etc.), an insulator layer 103 (e.g., a silicon dioxide layer, a silicon nitride layer, a silicon oxynitride layer or any other suitable insulator layer) on the semiconductor substrate 102 and a semiconductor layer on the insulator layer 103. Alternatively, the wafer can comprise a bulk semiconductor wafer comprising, for example, a bulk semiconductor substrate (e.g., a bulk silicon substrate or any other suitable bulk semiconductor structure (e.g., a bulk germanium substrate, a bulk gallium arsenide substrate, a bulk gallium nitride substrate, etc.). Optionally, in the case of a bulk semiconductor wafer, a dopant implantation process can be performed in order to form a buried well region that isolates the upper portion of the substrate from the lower portion of the substrate.

Figure 11:
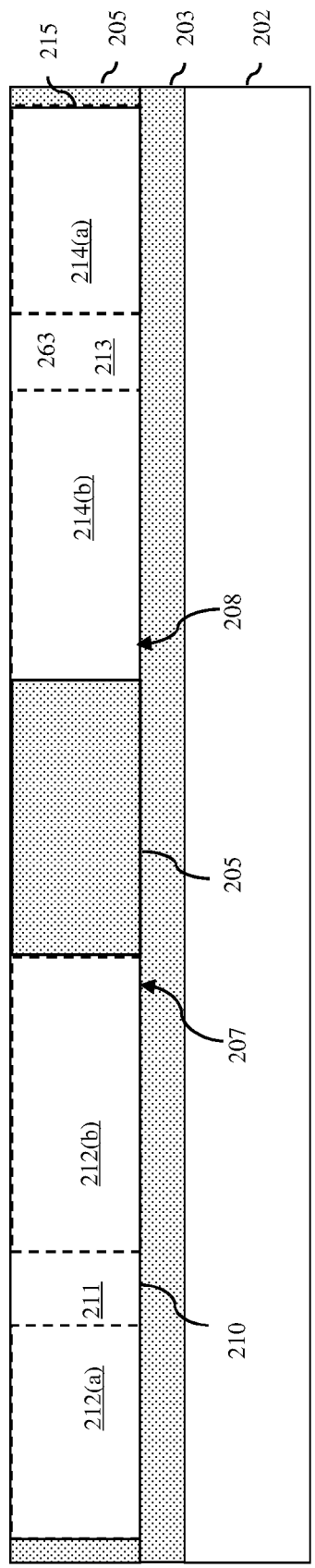
FIG. 11 is a cross-section diagram illustrating a partially completed semiconductor structure formed according to the method of FIG. 10.

The method can further comprise forming, on the wafer 201, a semiconductor body 210 for the first FET 291 and an additional semiconductor body 215 for the second FET 292 (1002). To form semiconductor bodies for planar FETs (as illustrated), a shallow trench isolation (STI) region 205 can be formed (e.g., using conventional STI formation techniques) in the semiconductor layer 204 above the insulator layer 203 (or in the upper portion of a bulk semiconductor substrate, if applicable) so as to define the shapes of two discrete essentially rectangular-shaped planar semiconductor bodies 210 and 215. The semiconductor bodies 210, 215 can be in end-to-end alignment (i.e., one end 207 of the semiconductor body 210 can be aligned with an adjacent end 208 of the additional semiconductor body 215) and physically separated by the isolation region 205, as shown in FIG. 11. Although not shown, to form semiconductor bodies for multi-gate non-planar FET(s) (e.g., dual-gate FETs, also referred to herein as fin-type FETs, and tri-gate FETs), two discrete essentially rectangular-shaped non-planar semiconductor bodies (also referred to herein as semiconductor fins) can be formed (e.g., using conventional lithographic or sidewall image transfer (SIT) patterning and etch techniques) from the semiconductor layer 204 above the insulator layer 203 (or from the upper portion of a bulk semiconductor structure, if applicable).

In any case, as shown in FIG. 10, the semiconductor body 210 can comprise at least the following components of the first FET 291: a first source/drain region 212(*a*); a second source/drain region 212(*b*) at one end 207 and, particularly, the end 207 adjacent to the isolation region 205 opposite the end 208 of the additional semiconductor body 215; and a channel region 211 positioned laterally between the first source/drain region 212(*a*) and the second source/drain region 212(*b*). Similarly, the additional semiconductor body 210 can comprise at least the following components of the second FET 292: an additional first source/drain region 214(*a*); an additional second source/drain region 214(*b*) at the end 208 of the additional semiconductor body 215 and, particularly, the end 208 adjacent to the isolation region 205 and opposite the end 207 of the semiconductor body 210; and an additional channel region 213 positioned laterally between the additional first source/drain region 214(*a*) and the additional second source/drain region 214(*b*). Although not shown, the semiconductor bodies 210 and 215 can each, optionally, comprise one or more additional components for the FETs 291 and 292 including, but not limited to, halo region(s) and source/drain extension region(s). Such regions are well known in the art and, thus, the details thereof are omitted from this specification in order to allow the reader to focus on the salient aspects of the disclosed semiconductor structures.

It should be understood that, as in conventional FET processing, doping processes used to achieve desired conductivity types and levels in the regions described above (i.e., the channel regions 211, 213, S/D regions 212(*a*)-(*b*), 214(*a*)-(*b*), S/D extension region(s) and halo region(s)) may occur at various different times during processing (e.g., before gate formation; after gate formation, but before sidewall spacer formation; etc.). Such doping processes are well known in the art and, thus, the details are omitted from this specification in order to allow the reader to focus on the salient aspects of the disclosed method.

The method can further comprise forming multiple gates (1004). Specifically, as shown in FIGS. 5A-5B and 6A-6B, the following gates can be formed at process 1004: a first gate 221 for the first FET 291 adjacent to the semiconductor body 210 at the channel region 211; a second gate 222 and, particularly, a gate that will be a non-functioning gate (i.e., that will be an inactive gate) adjacent to the semiconductor body 210 at the interface between the isolation region 205 and the second source/drain region 212(*b*) such that the second source/drain region 212(*b*) is between the first gate 221 and the second gate 122; an additional first gate 223 for the second FET 292 adjacent to the semiconductor body 215 at the additional channel region 213; and an additional second gate 224 and, particularly, an additional gate that will be an additional non-functioning gate (i.e., that will be an additional inactive gate) adjacent to the semiconductor body 215 at the interface between the isolation region 205 and the additional second source/drain region 214(*b*) such that the additional second source/drain region 214(*b*) is between the additional first gate 223 and the additional second gate 224.

These gates can be formed and, particularly, patterned at process 1004 so as to have an approximately uniform pitch. These gates can further be formed and, particularly, patterned so that they all have the same gate length or so that the functioning and non-functioning gates have different lengths (1005). That is, they can all be formed so that the length 261 of the first gate 221, the length 262 of the second gate 222 and the lengths 263 and 264 of the additional first and second gates 223 and 224, respectively, are all approximately equal, as shown in the embodiment 200A of FIGS. 5A-5B. Alternatively, they can be formed such that the lengths 261 and 263 of the first gate 221 and additional first gate 223, respectively, (i.e., the lengths of the functioning gates) are greater than the lengths 262 and 264 of the second gate 222 and additional second gate 224, respectively, (i.e., the lengths of the non-functioning gates), as shown in embodiments 200B of FIGS. 6A-6B.

The gates can be formed at process 1004 using, for example, conventional gate processing techniques such that all of the gates (i.e., the first gate 221 of the first FET 291, the second gate 222, the additional first gate 223 of the second FET 292 and the additional second gate 224) have the same composition. For example, they can all be formed as conventional gates. That is, one or more gate dielectric layers (e.g., a silicon oxide gate dielectric layer) can be deposited over the semiconductor bodies 210 and 215 and one or more gate conductor layers (e.g., a polysilicon gate conductor layer) can be deposited over the gate dielectric layer(s). The stack of gate dielectric and gate conductor layers can then be lithographically patterned and etch to form multiple conventional gates, having the gate pitch, gate lengths, etc., as described above. Next, gate sidewall spacers 225 (e.g., silicon nitride gate sidewall spacers) can be formed on the sidewalls of the gates (e.g., using conventional sidewall spacer formation techniques).

Alternatively, the gates can be formed at process 1004 using, for example, replacement metal gate processing techniques such that all of the gates (i.e., the first gate 221 of the first FET 291, the second gate 222, the additional first gate 223 of the second FET 292 and the additional second gate 224) comprise replacement metal gates or such that the first gate 221 and additional first gate 223 (i.e., the functioning gates) comprise replacement metal gates and the second gate 222 and additional second gate 224 (i.e., the non-functioning gates) comprise dummy gates. That is, a blanket layer of a dummy gate material (e.g., a semiconductor material, such as silicon, polysilicon, or amorphous silicon, or a dielectric material) can be deposited over the semiconductor bodies 210 and 215. This blanket layer can be lithographically patterned and etched to form multiple dummy gates. The multiple dummy gates can have the same positions, gate pitch, gate lengths, etc. as required for the gates 221-223. Next, gate sidewall spacers 225 (e.g., silicon nitride gate sidewall spacers) can be formed on the sidewalls of the dummy gates (e.g., using conventional sidewall spacer formation techniques). Following gate sidewall spacer formation, one or more layers of interlayer dielectric material 290 can be deposited over the dummy gates and planarized to expose the top surfaces of the dummy gates. The interlayer dielectric material can comprise, for example, one or more layers of any of the following: silicon dioxide, silicon nitride, silicon oxynitride, borophosphosilicate glass (BPSG), phosphosilicate glass (BPSG), boron silicate glass (BSG), undoped silicate glass (USG), or any other suitable interlayer dielectric material. Next, either all of the dummy gates or only the dummy gates corresponding to the first gate 221 and additional first gate 223 (i.e., the functioning gates for the FETs 291 and 292) can be selectively removed, creating openings in the interlayer dielectric material that are lined with gate sidewall spacers 225. It should be noted that the dummy gate material, sidewall spacer material and interlayer dielectric material should be different materials so as to allow the dummy gates to be selectively removed. Replacement metal gates can then be formed in these openings by depositing a conformal high-K gate dielectric layer and, then, forming one or more metal layers on the high-K gate dielectric layer.

It should be noted that in the embodiment 200A of FIGS. 5A-5B all of the gates are laterally surrounded by gate sidewall spacers 225 (e.g., silicon nitride gate sidewall spacers). However, in the embodiment 200B of FIGS. 6A-6B only the first gate 221 of the first FET 291 and the additional first gate 223 of the second FET 292 (i.e., the functioning gates for the FETs 291-292) have gate sidewall spacers 225 and the second gate 222 and the additional second gate 224 (i.e., the non-functioning gates) are devoid of such gate sidewall spacers. To achieve the embodiment 200A, all the gates can be formed, as described above, so as to have gate sidewall spacers or, alternatively, to achieve the embodiment 200B, the second gate 222 and additional second gate 224 can be masked during gate sidewall spacer formation or any gate sidewall spacer material formed on the second gate 222 and additional second gate 224 during gate sidewall spacer formation can be removed (1006).

Following formation of the multiple gates, one or more layers of interlayer dielectric material 290 can be deposited so as to cover the multiple gates and any exposed portions of the semiconductor bodies 210 and 215 adjacent to those gates (i.e., any exposed source/drain regions 212(a)-(b), 214(a)-(b)) (1008). The interlayer dielectric material can comprise, for example, one or more layers of any of the following: silicon dioxide, silicon nitride, silicon oxynitride, borophosphosilicate glass (BPSG), phosphosilicate glass (BPSG), boron silicate glass (BSG), undoped silicate glass (USG), or any other suitable interlayer dielectric material.

Next, multiple contacts can be formed that extend through the interlayer dielectric material 290 to various components of the FETs 291 and 292 (e.g., to the source/drain regions 212(a)-(b), 214(a)-(b) (as illustrated), to the functioning gates (i.e., the first gate 221 and additional first gate 223) (not shown), etc.) (1010). For the first FET 291, the source/drain contacts can comprise a first source/drain contact 231 on the first source/drain region 212(a) and a second source/drain contact 232 on the second source/drain region 212(b). For the second FET 292, these contacts can comprise an additional first source/drain contact 233 on the additional first source/drain region 214(a); and an additional second source/drain contact 234 on the additional second source/drain region 214(b).

The contacts can be formed and, particularly, patterned at process 1010 such that the second source/drain contact 232 is wider than the first source/drain contact 231 and, similarly, such that the additional second source/drain contact 234 is wider than the additional first source/drain contact 233. Thus, the second source/drain contact 232 will have lower resistance than the first source/drain contact 231 in the first FET 291 and the additional second source/drain contact 234 will have a lower resistance than the additional first source/drain contact 233 in the second FET 292. Additionally, the contacts can be formed and, particularly, patterned at process 1010 such that the second source/drain contact 232 is separated from the first gate 221 by some distance 251 (referred to herein as a first distance) and extends laterally onto the second gate 222. In this case, the contacts can be formed such that the first source/drain contact 231 is separated from the first gate 221 by some distance 253, which is either approximately equal to the first distance 251 that separates the first gate 221 from the second source/drain contact 232 (see the embodiment 200A of FIGS. 5A-5B) or less than that that first distance 251 (see the embodiment 200B of FIGS. 6A-6B) (1012). The contacts can further be formed and, particularly, patterned such that the additional first and second source/drain contacts 233-234 in the second FET 292 are similarly positioned such that the FETs 291 and 292 are essentially symmetric.

The contacts can be formed at process 1010, as described above, using, for example, damascene contact formation techniques, self-aligned contact formation techniques or any other suitable contact formation techniques. These techniques are well known in the art and, thus, the details have been omitted from this specification in order to allow the reader to focus on the salient aspects of the disclosed method.

Placement of the first and second source/drain contacts 231-232 relative to the first gate 221 and placement of the second source/drain contact 232 relative to the second gate 222 at process 1010, as described above, ensures the first gate-to-second source/drain contact capacitance in the first FET 291 will be approximately equal to the first gate-to-first source/drain contact capacitance (see embodiments 200A of FIGS. 5A-5B) or less than the first gate-to-first source/drain contact capacitance (see embodiments 1200B of FIGS. 6A-6B). Since the second FET 292 is essentially symmetrical to the first FET 291, the additional first gate-to-additional second source/drain contact capacitance in the second FET 292 will similarly be equal to or less than the additional first gate-to-additional first source/drain contact capacitance. Furthermore, reducing the lengths of the second gate 222 and additional second gate 224 relative to the lengths of the first gate 221 and the additional first gate 223, respectively, and/or removing the gate sidewall spacer from the second gate 222 and additional second gate 224 (see the optional process steps described above), opens up more surface area of the semiconductor bodies 210 and 215 available for formation of the second source/drain contact 232 and the additional second source/drain contact 234 and, thereby allows the widths of those contacts 232 and 234 to be maximized to further reduce contact resistance without moving them closer to the gates 221 and 223, respectively and, thereby without further increasing gate-to-source/drain contact capacitance.

It should be understood that in the semiconductor structures formed according to the methods of FIG. 7 or FIG. 10 above the difference between the functioning gates and the non-functioning gates is that contacts are formed to the functioning gates at process 710 of FIG. 7 or process 1010 of FIG. 10, but not to the non-functioning gates. Thus, each functioning gate can be electrically connected during subsequent back end of the line (BEOL) processing to a power supply or other device, which can selectively apply a voltage to the functioning gate in order to alter current flow in the adjacent channel (i.e., to selectively turn on or off the FET, depending upon the conductivity type). Since contacts are formed at process 710 of FIG. 7 or process 1010 of FIG. 10 to the non-functioning gates, the non-functioning gates are not subsequently connected to a power supply or other device and, thus, they remain permanently inactive and unable to alter current flow within the adjacent semiconductor body.

Figure 12:
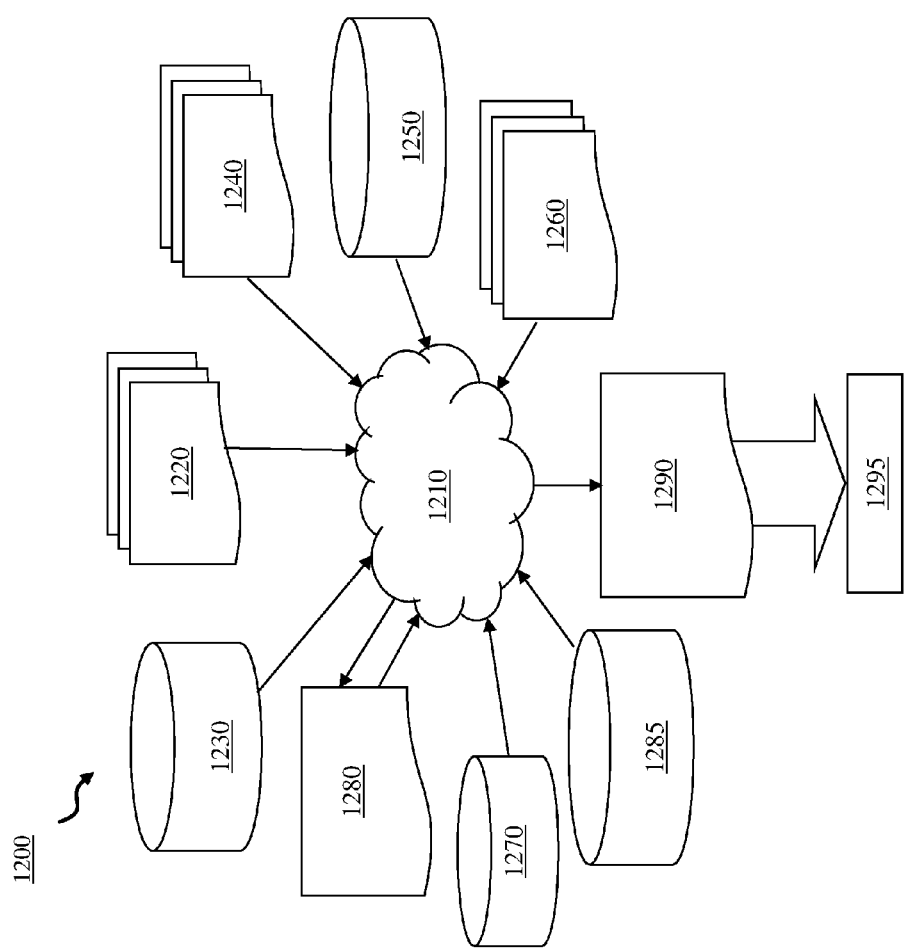
FIG. 12 shows a block diagram illustrating an exemplary design flow used in the design, simulation, test, layout, and manufacture of the semiconductor structures disclosed herein; and, FIG. 13 is schematic diagram illustrating an exemplary computer system that can be used to implement the design flow of FIG. 12.

FIG. 12 shows a block diagram of an exemplary design flow 1200 used for example, in semiconductor IC logic design, simulation, test, layout, and manufacture. Design flow 1200 includes processes, machines and/or mechanisms for processing design structures or devices to generate logically or otherwise functionally equivalent representations of the design structures and/or devices described above and shown in FIGS. 1A-1B, 2B-2B, 3A-3B, 4A-4B, 5A-5B and 6A-6B. The design structures processed and/or generated by design flow 1200 may be encoded on machine-readable transmission or storage media to include data and/or instructions that when executed or otherwise processed on a data processing system generate a logically, structurally, mechanically, or otherwise functionally equivalent representation of hardware components, circuits, devices, or systems. Machines include, but are not limited to, any machine used in an IC design process, such as designing, manufacturing, or simulating a circuit, component, device, or system. For example, machines may include: lithography machines, machines and/or equipment for generating masks (e.g. e-beam writers), computers or equipment for simulating design structures, any apparatus used in the manufacturing or test process, or any machines for programming functionally equivalent representations of the design structures into any medium (e.g. a machine for programming a programmable gate array).

Design flow 1200 may vary depending on the type of representation being designed. For example, a design flow 1200 for building an application specific IC (ASIC) may differ from a design flow 1200 for designing a standard component or from a design flow 1200 for instantiating the design into a programmable array, for example a programmable gate array (PGA) or a field programmable gate array (FPGA) offered by Altera® Inc. or Xilinx® Inc.

FIG. 12 illustrates multiple such design structures including an input design structure 1220 that is preferably processed by a design process 1210. Design structure 1220 may be a logical simulation design structure generated and processed by design process 1210 to produce a logically equivalent functional representation of a hardware device. Design structure 1220 may also or alternatively comprise data and/or program instructions that when processed by design process 1210, generate a functional representation of the physical structure of a hardware device. Whether representing functional and/or structural design features, design structure 1220 may be generated using electronic computer-aided design (ECAD) such as implemented by a core developer/designer. When encoded on a machine-readable data transmission, gate array, or storage medium, design structure 1220 may be accessed and processed by one or more hardware and/or software modules within design process 1210 to simulate or otherwise functionally represent an electronic component, circuit, electronic or logic module, apparatus, device, or system such as those shown in FIGS. 1A-1B, 2B-2B, 3A-3B, 4A-4B, 5A-5B and 6A-6B. As such, design structure 1220 may comprise files or other data structures including human and/or machine-readable source code, compiled structures, and computer executable code structures that when processed by a design or simulation data processing system, functionally simulate or otherwise represent circuits or other levels of hardware logic design. Such data structures may include hardware-description language (HDL) design entities or other data structures conforming to and/or compatible with lower-level HDL design languages such as Verilog and VHDL, and/or higher-level design languages such as C or C++.

Design process 1210 preferably employs and incorporates hardware and/or software modules for synthesizing, translating, or otherwise processing a design/simulation functional equivalent of the components, circuits, devices, or logic structures shown in FIGS. 1A-1B, 2B-2B, 3A-3B, 4A-4B, 5A-5B and 6A-6B to generate a Netlist 1280 which may contain design structures such as design structure 1220. Netlist 1280 may comprise, for example, compiled or otherwise processed data structures representing a list of wires, discrete components, logic gates, control circuits, I/O devices, models, etc. that describes the connections to other elements and circuits in an integrated circuit design. Netlist 1280 may be synthesized using an iterative process in which netlist 1280 is resynthesized one or more times depending on design specifications and parameters for the device. As with other design structure types described herein, netlist 1280 may be recorded on a machine-readable data storage medium or programmed into a programmable gate array. The medium may be a non-volatile storage medium such as a magnetic or optical disk drive, a programmable gate array, a compact flash, or other flash memory. Additionally, or in the alternative, the medium may be a system or cache memory, buffer space, or electrically or optically conductive devices and materials on which data packets may be transmitted and intermediately stored via the Internet, or other networking suitable means.

Design process 1210 may include hardware and software modules for processing a variety of input data structure types including Netlist 1280. Such data structure types may reside, for example, within library elements 1230 and include a set of commonly used elements, circuits, and devices, including models, layouts, and symbolic representations, for a given manufacturing technology (e.g., different technology nodes, 32 nm, 45 nm, 90 nm, etc.). The data structure types may further include design specifications 1240, characterization data 1250, verification data 1260, design rules 1270, and test data files 1285 which may include input test patterns, output test results, and other testing information. Design process 1210 may further include, for example, standard mechanical design processes such as stress analysis, thermal analysis, mechanical event simulation, process simulation for operations such as casting, molding, and die press forming, etc. One of ordinary skill in the art of mechanical design can appreciate the extent of possible mechanical design tools and applications used in design process 1210 without deviating from the scope and spirit of the invention. Design process 1210 may also include modules for performing standard circuit design processes such as timing analysis, verification, design rule checking, place and route operations, etc.

Design process 1210 employs and incorporates logic and physical design tools such as HDL compilers and simulation model build tools to process design structure 1220 together with some or all of the depicted supporting data structures along with any additional mechanical design or data (if applicable), to generate a second design structure 1290. Design structure 1290 resides on a storage medium or programmable gate array in a data format used for the exchange of data of mechanical devices and structures (e.g.

information stored in a IGES, DXF, Parasolid XT, JT, DRG, or any other suitable format for storing or rendering such mechanical design structures). Similar to design structure 1220, design structure 1290 preferably comprises one or more files, data structures, or other computer-encoded data or instructions that reside on transmission or data storage media and that when processed by an ECAD system generate a logically or otherwise functionally equivalent form of one or more of the embodiments of the invention shown in FIGS. 1A-1B, 2B-2B, 3A-3B, 4A-4B, 5A-5B and 6A-6B. In one embodiment, design structure 1290 may comprise a compiled, executable HDL simulation model that functionally simulates the devices shown in FIGS. 1A-1B, 2B-2B, 3A-3B, 4A-4B, 5A-5B and 6A-6B.

Design structure 1290 may also employ a data format used for the exchange of layout data of integrated circuits and/or symbolic data format (e.g. information stored in a GDSII (GDS2), GL1, OASIS, map files, or any other suitable format for storing such design data structures). Design structure 1290 may comprise information such as, for example, symbolic data, map files, test data files, design content files, manufacturing data, layout parameters, wires, levels of metal, vias, shapes, data for routing through the manufacturing line, and any other data required by a manufacturer or other designer/developer to produce a device or structure as described above and shown in FIGS. 1A-1B, 2B-2B, 3A-3B, 4A-4B, 5A-5B and 6A-6B. Design structure 1290 may then proceed to a stage 1295 where, for example, design structure 1290: proceeds to tape-out, is released to manufacturing, is released to a mask house, is sent to another design house, is sent back to the customer, etc.

Figure 13:
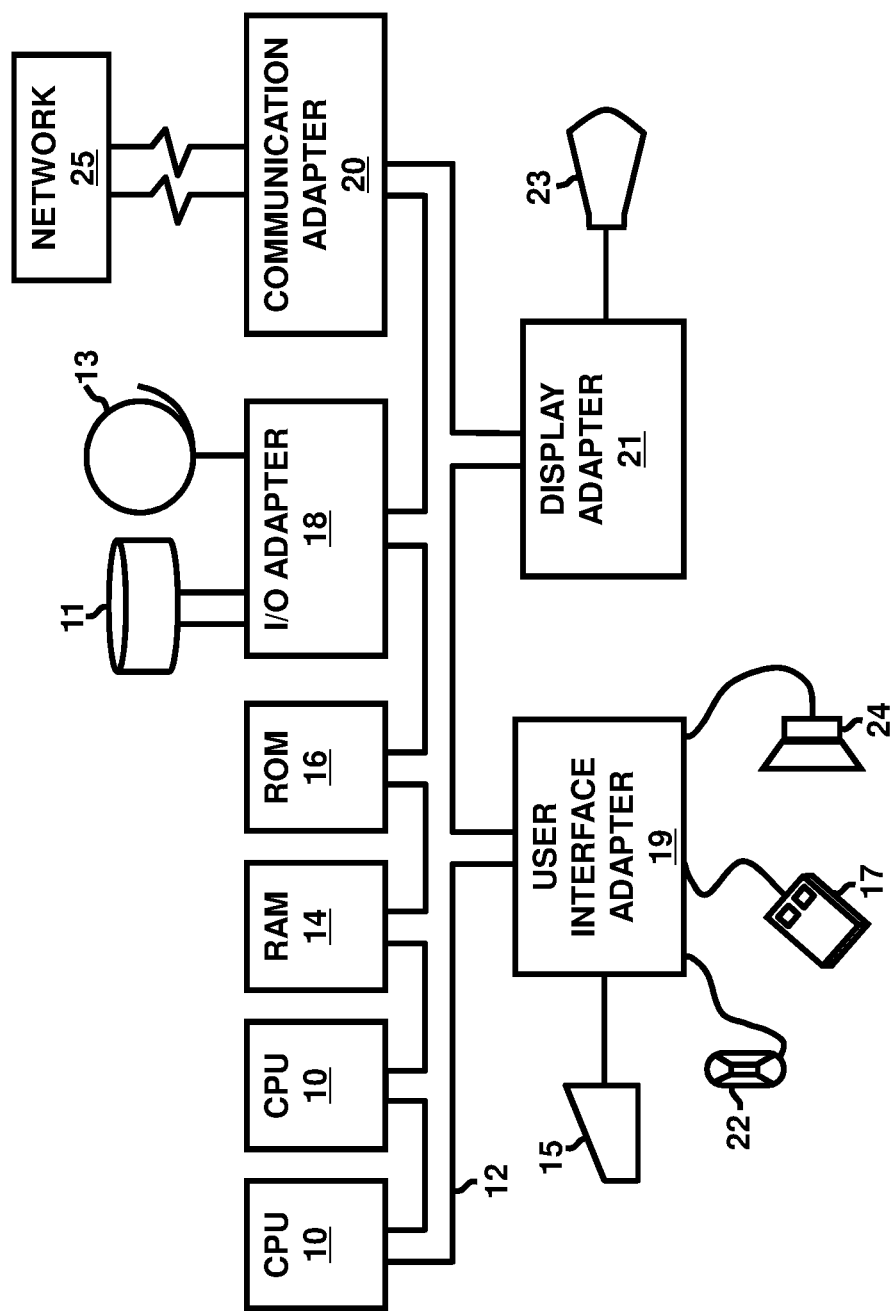

A representative hardware environment (i.e., a computer system) for implementing the above described design flow is depicted in FIG. 13. This schematic drawing illustrates a hardware configuration of an information handling/computer system in accordance with the embodiments herein. The system comprises at least one processor or central processing unit (CPU) 10. The CPUs 10 are interconnected via a system bus 12 to various devices such as a random access memory (RAM) 14, read-only memory (ROM) 16, and an input/output (I/O) adapter 18. The I/O adapter 18 can connect to peripheral devices, such as disk units 11 and tape drives 13, or other program storage devices that are readable by the system. The system can read the inventive instructions on the program storage devices and follow these instructions to execute the methodology of the embodiments herein. The system further includes a user interface adapter 19 that connects a keyboard 15, mouse 17, speaker 24, microphone 22, and/or other user interface devices such as a touch screen device (not shown) to the bus 12 to gather user input. Additionally, a communication adapter 20 connects the bus 12 to a data processing network 25, and a display adapter 21 connects the bus 12 to a display device 23 which may be embodied as an output device such as a monitor, printer, or transmitter, for example.

It should be understood that the terminology used herein is for the purpose of describing the disclosed structures and methods and is not intended to be limiting. For example, as used herein, the singular forms "a", "an" and "the" are intended to include the plural forms as well, unless the context clearly indicates otherwise. Additionally, as used herein, the terms "comprises" "comprising", "includes" and/or "including" specify the presence of stated features, integers, steps, operations, elements, and/or components, but do not preclude the presence or addition of one or more other features, integers, steps, operations, elements, components, and/or groups thereof. Furthermore, as used herein, terms such as "right", "left", "vertical", "horizontal", "top", "bottom", "upper", "lower", "under", "below", "underlying", "over", "overlying", "parallel", "perpendicular", etc., are intended to describe relative locations as they are oriented and illustrated in the drawings (unless otherwise indicated) and terms such as "touching", "on", "in direct contact", "abutting", "directly adjacent to", etc., are intended to indicate that at least one element physically contacts another element (without other elements separating the described elements). The corresponding structures, materials, acts, and equivalents of all means or step plus function elements in the claims below are intended to include any structure, material, or act for performing the function in combination with other claimed elements as specifically claimed.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

Therefore, disclosed above are semiconductor structures comprising at least one field effect transistor (FET) having a low-resistance source/drain contact and, optionally, low gate-to-source/drain contact capacitance. The semiconductor structures can comprise a semiconductor body and, within the semiconductor body, first and second source/drain regions and a channel region for a FET. A first gate for the FET can be adjacent to the semiconductor body at the channel region and a non-functioning second gate can be adjacent to the semiconductor body such that the second source/drain region is between the first and second gates. First and second source/drain contacts can be on the first and second source/drain regions, respectively. The second source/drain contact can be wider than the first so as to have a lower resistance than the first source/drain contact. Additionally, spacing of the first and second source/drain contacts relative to the first gate can be such that the first gate-to-second source/drain contact capacitance is equal to or less than the first gate-to-first source/drain contact capacitance.

What is claimed is:

1. A method of forming a semiconductor structure, said method comprising:
    forming a semiconductor body comprising:
        a first source/drain region;
        a second source/drain region; and,
        a channel region between said first source/drain region and said second source/drain region;
    forming multiple gates comprising:
        a first gate adjacent to said semiconductor body at said channel region; and,
        a second gate adjacent to said semiconductor body, wherein opposing ends of said second gate in a channel width direction are above said isolation region and opposing ends of said second gate in a channel length direction are above said semiconductor body, said second source/drain region being within said semiconductor body between said first gate and said second gate; and, forming multiple contacts comprising:
  a first source/drain contact on said first source/drain region; and,
  a second source/drain contact on said second source/drain region and wider than said first source/drain contact, wherein said second source/drain contact is physically separated from said first gate and from said second gate and, wherein said second source/drain contact is and closer to said second gate than said first gate.

2. The method of claim 1, wherein either:
said first gate and said second gate have essentially identical gate layers, or
said first gate comprises replacement metal gate layers and said second gate comprises non-metal dummy gate layers.

3. The method of claim 1,
said multiple contacts being formed such that said second source/drain contact is physically separated from said first gate by a first distance and from said second gate by a second distance that is less than said first distance, and
said multiple contacts further being formed such that said first source/drain contact is physically separated from said first gate by a third distance, said third distance being approximately equal to said first distance.

4. The method of claim 1,
said multiple contacts being formed such that said second source/drain contact is physically separated from said first gate by a first distance and from said second gate by a second distance that is less than said first distance, and
said multiple contacts further being formed such that said first source/drain contact is physically separated from said first gate by a third distance, said third distance being less than said first distance.

5. The method of claim 1, further comprising forming a gate sidewall spacer around said first gate but not said second gate, wherein said multiple gates are formed such that said first gate has a first gate length and said second gate has a second gate length that is less than said first gate length.

6. The method of claim 1,
said first source/drain region, said channel region and said second source/drain region being for a first field effect transistor,
said semiconductor body further comprising: an additional source/drain region for a second field effect transistor and a well region positioned laterally between said second source/drain region and said additional source/drain region,
said well region and said channel region having a first type conductivity,
said first source/drain region and said second source/drain region having a second type conductivity that is different from said first type conductivity,
said second gate being adjacent to said semiconductor body at said well region, and
said multiple contacts comprising an additional source/drain contact on said additional source/drain region.

7. The method of claim 6, said multiple contacts being formed such that said second source/drain contact and said additional source/drain contact have equal widths and are physically separated from said second gate by equal distances.

8. The method of claim 1,
wherein said semiconductor body is laterally surrounded by an isolation region,
wherein said second gate extends across said semiconductor body onto said isolation region such that opposing ends of said second gate are aligned above said isolation region.

9. The method of claim 1, further comprising forming dielectric material above said multiple gates and above said semiconductor body between said multiple gates,
said forming of said multiple contacts comprising forming said first source/drain contact such that said first source/drain contact extends vertically through said dielectric material to said first source/drain region and is essentially parallel to and physical separated from said first gate, and forming said second source/drain contact such that said second source/drain contact extends vertically through said dielectric material to said second source/drain contact and is essentially parallel to and physically separated from said first gate and said second gate.

10. A method of forming a semiconductor structure, said method comprising:
forming a semiconductor body laterally surrounded by an isolation region, said semiconductor body comprising:
  a first source/drain region;
  a second source/drain region;
  a channel region between said first source/drain region and said second source/drain region; and
  a well region, said second source/drain region being between and immediately adjacent to said channel region and said well region, wherein said channel region and said well region have a first type conductivity and said first source/drain region and said second source/drain region have a second type conductivity that is different from said first type conductivity;
forming multiple gates comprising:
  a first gate adjacent to and extending across said semiconductor body at said channel region, said first gate having a first sidewall and a gate sidewall spacer positioned laterally immediately adjacent to said first sidewall; and,
  a second gate adjacent to and extending across said semiconductor body at said well region such that opposing ends of said second gate in a channel width direction are above said isolation region and opposing ends of said second gate in a channel length direction are above said semiconductor body, said second gate having a second sidewall;
depositing dielectric material such that said dielectric material is above said semiconductor body so as to be positioned laterally adjacent to and between said multiple gates, wherein said dielectric material is physically separated from said first sidewall by said gate sidewall spacer and immediately adjacent to said second sidewall; and,
forming multiple contacts that extend through said dielectric material, said multiple contacts comprising:
  a first source/drain contact on said first source/drain region; and,
  a second source/drain contact on said second source/drain region, wider than said first source/drain contact and closer to said second gate than said first gate.

11. The method of claim 10, wherein either said first gate and said second gate have essentially identical gate layers or said first gate comprises replacement metal gate layers and said second gate comprises non-metal dummy gate layers.

12. The method of claim 10, said multiple contacts further being formed such that said second source/drain contact has lower resistance than said first source/drain contact and such that capacitance between said second source/drain contact and said first gate is less than capacitance between said first source/drain contact and said first gate.

13. The method of claim 10, said multiple gates being formed such that said first gate is longer than said second gate and, thereby such that said channel region is longer than said well region.

14. The method of claim 13, said multiple contacts being formed such that said second source/drain contact is physically separated from said first gate by a first distance, such that said second source/drain contact is physically separated from said second gate by a second distance that is less than said first distance, and such that said first source/drain contact is physically separated from said first gate by a third distance that is less than said first distance.

15. The method of claim 10,
wherein said first source/drain region, said second source/drain region and said channel region are for a first field effect transistor,
wherein said semiconductor body further comprises an additional source/drain region for a second field effect transistor position laterally adjacent to said well region such that said well region is between said second source/drain region and the additional source/drain region, and
wherein said multiple contacts are formed such that said multiple contacts further comprise an additional source/drain contact on said additional source/drain region, said additional source/drain contact and said second source/drain contact having equal widths and being physically separated from said second gate by equal distances.

16. A method of forming a semiconductor structure, said method comprising:
forming a semiconductor body laterally surrounded by an isolation region, said semiconductor body comprising: a first source/drain region; a second source/drain region at one end; and, a channel region positioned laterally between said first source/drain region and said second source/drain region;
forming multiple gates comprising:
a first gate adjacent to and extending across said semiconductor body at said channel region, said first gate having a first sidewall and a gate sidewall spacer positioned laterally immediately adjacent to said first sidewall and said first gate having a first gate length; and,
a second gate adjacent to and extending across said semiconductor body at an interface between said isolation region and said semiconductor body adjacent to said second source/drain region such that opposing ends and one side of said second gate are aligned above said isolation region, said second source/drain region being positioned between said first gate and said second gate, said second gate having a second sidewall and a second gate length that is shorter than said first gate length;
depositing dielectric material such that said dielectric material is above said semiconductor body so as to be positioned laterally adjacent to and between said multiple gates, wherein said dielectric material is physically separated from said first sidewall by said gate sidewall spacer and immediately adjacent to said second sidewall; and,
forming multiple contacts comprising:
a first source/drain contact on said first source/drain region; and,
a second source/drain contact on said second source/drain region, wider than said first source/drain contact and extending laterally onto said second gate.

17. The method of claim 16, said multiple contacts being formed such that said first source/drain contact and said second source/drain contact are physically separated from said first gate by equal distances and such that said second source/drain contact is physically separated from said second gate by a lesser distance.

18. The method of claim 16, said multiple contacts being formed such that said second source/drain contact is physically separated from said first gate by a first distance, such that said second source/drain contact is physically separated from said second gate by a second distance that is less than said first distance, and such that said first source/drain contact is physically separated from said first gate by a third distance that is less than said first distance.

19. The method of claim 16, said forming of said multiple gates being performed so that either said first gate and said second gate have essentially identical gate layers or said first gate comprises replacement metal gate layers and said second gate comprises non-metal dummy gate layers.

20. The method of claim 16, said second source/drain contact further extending laterally over the second gate and onto said isolation region.

* * * * *